(12) United States Patent
Jung et al.

(10) Patent No.: US 11,940,830 B2
(45) Date of Patent: Mar. 26, 2024

(54) LOW DROPOUT REGULATOR AND MEMORY DEVICE INCLUDING THE SAME

(71) Applicant: SAMSUNG ELECTRONICS CO., LTD., Suwon-si (KR)

(72) Inventors: Jinook Jung, Suwon-si (KR); Jaewoo Park, Yongin-si (KR); Junhan Choi, Suwon-si (KR); Myoungbo Kwak, Seoul (KR); Junghwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 140 days.

(21) Appl. No.: 17/709,853

(22) Filed: Mar. 31, 2022

(65) Prior Publication Data

US 2023/0045744 A1    Feb. 9, 2023

(30) Foreign Application Priority Data

Aug. 6, 2021  (KR) .................. 10-2021-0103589

(51) Int. Cl.
*G11C 11/4074* (2006.01)
*G05F 1/575* (2006.01)
*G11C 11/4076* (2006.01)
*G11C 11/4093* (2006.01)

(52) U.S. Cl.
CPC .......... *G05F 1/575* (2013.01); *G11C 11/4074* (2013.01); *G11C 11/4076* (2013.01); *G11C 11/4093* (2013.01)

(58) Field of Classification Search
CPC ............................ G05F 1/575; G11C 11/4074
USPC ................................................... 365/226
See application file for complete search history.

(56) References Cited

U.S. PATENT DOCUMENTS

| | | | |
|---|---|---|---|
| 7,397,226 B1* | 7/2008 | Mannama | G05F 1/575 327/558 |
| 7,405,546 B2 | 7/2008 | Amrani et al. | |
| 2003/0102851 A1 | 6/2003 | Stanescu et al. | |
| 2011/0063915 A1* | 3/2011 | Tanaka | G11C 16/32 365/205 |
| 2012/0049951 A1* | 3/2012 | Venkataraman | G11C 27/026 330/112 |
| 2014/0084896 A1 | 3/2014 | Zhang et al. | |
| 2020/0201374 A1* | 6/2020 | Golara | H03F 3/45183 |

* cited by examiner

*Primary Examiner* — Muna A Techane
(74) *Attorney, Agent, or Firm* — Muir Patent Law, PLLC

(57) ABSTRACT

Disclosed is a low dropout regulator which includes a first resistor, a first transistor including a gate terminal connected with a first end of the first resistor, a source terminal connected with a power supply voltage terminal, and a drain terminal connected with a first node, an operational amplifier including input terminals respectively connected with a reference voltage and the first node and an output terminal, a second transistor including a gate terminal connected with the output terminal of the operational amplifier, a source terminal connected with the first node, and a drain terminal connected with a second node, a third transistor including a gate terminal connected with a second end of the first resistor, a source terminal connected with the power supply voltage terminal, and a drain terminal connected with a third node, and a current source connected between the second node and a ground voltage terminal.

11 Claims, 19 Drawing Sheets

LOW DROPOUT REGULATOR AND MEMORY DEVICE INCLUDING THE SAME

CROSS-REFERENCE TO RELATED APPLICATION

This application claims priority under 35 U.S.C. § 119 to Korean Patent Application No. 10-2021-0103589 filed on Aug. 6, 2021, in the Korean Intellectual Property Office, the disclosure of which is incorporated by reference herein in its entirety.

BACKGROUND

1. Field

Embodiments relate to a low dropout regulator and a memory device including the same.

2. Description of the Related Art

A regulator is configured to consistently maintain a level of an output voltage at a target level. The regulator is being used in various electronic devices to provide a uniform voltage thereto. For example, when current consumption of a load increases, there is a tendency that the level of the output voltage decreases. In this case, the regulator may maintain the level of the output voltage at the target level by increasing the amount of output current. For another example, when current consumption of the load decreases, there is a tendency that the level of the output voltage increases. In this case, the regulator may maintain the level of the output voltage at the target level by decreasing the amount of output current.

SUMMARY

According to an embodiment, a low dropout (LDO) regulator includes a first resistor, a first transistor that includes a gate terminal connected with a first end of the first resistor, a source terminal connected with a power supply voltage terminal, and a drain terminal connected with a first node, an operational amplifier that includes input terminals respectively connected with a reference voltage and the first node and an output terminal, a second transistor that includes a gate terminal connected with the output terminal of the operational amplifier, a source terminal connected with the first node, and a drain terminal connected with a second node, a third transistor that includes a gate terminal connected with a second end of the first resistor, a source terminal connected with the power supply voltage terminal, and a drain terminal connected with a third node, and a current source that is connected between the second node and a ground voltage terminal.

According to an embodiment, a low dropout (LDO) regulator includes a first transistor that outputs an output voltage in response to a pass gate voltage, a second transistor that receives the output voltage and to output the pass gate voltage, an active inductor that includes a third transistor and a first resistor, and an operational amplifier configured to amplify a difference between a reference voltage and the output voltage to output an OP amp output voltage. When a level of the output voltage decreases due to an increase in a level of a current flowing to a system load, a first loop in which the second transistor outputs the pass gate voltage of a decreased level and the first transistor outputs the output voltage of an increased level in response to the pass gate voltage of the decreased level is repeated such that the level of the output voltage is recovered and is uniformly maintained. When the level of the output voltage increases due to a decrease in the level of the current flowing to the system load, the first loop in which the second transistor outputs the pass gate voltage of an increased level and the first transistor outputs the output voltage of a decreased level in response to the pass gate voltage of the increased level is repeated such that the level of the output voltage is recovered and is uniformly maintained.

According to an embodiment, a memory device includes a bank that includes at least one memory cell array, a bank controller that controls the bank, a data buffer that transmits write data to the bank or receives read data from the bank, a clock buffer that receives a clock signal and outputs an internal clock signal, a serializer that operates based on the internal clock signal and serializes bits of the read data, a deserializer that operates based on the internal clock signal and parallelizes bits of the write data, and a low dropout (LDO) regulator that provides an output voltage to the clock buffer and maintains a level of the output voltage in response to an increase or decrease in a load on the clock buffer. The LDO regulator includes a first resistor, a first transistor including a gate terminal connected with a first end of the first resistor, a source terminal connected with a power supply voltage terminal, and a drain terminal connected with a first node, an operational amplifier including input terminals respectively connected with a reference voltage and the first node and an output terminal, a second transistor including a gate terminal connected with the output terminal of the operational amplifier, a source terminal connected with the first node, and a drain terminal connected with a second node, a third transistor including a gate terminal connected with a second end of the first resistor, a source terminal connected with the power supply voltage terminal, and a drain terminal connected with a third node, and a current source connected between the second node and a ground voltage terminal.

BRIEF DESCRIPTION OF THE FIGURES

Features will become apparent to those of skill in the art by describing in detail example embodiments with reference to the attached drawings in which.

DETAILED DESCRIPTION

Figure 1:
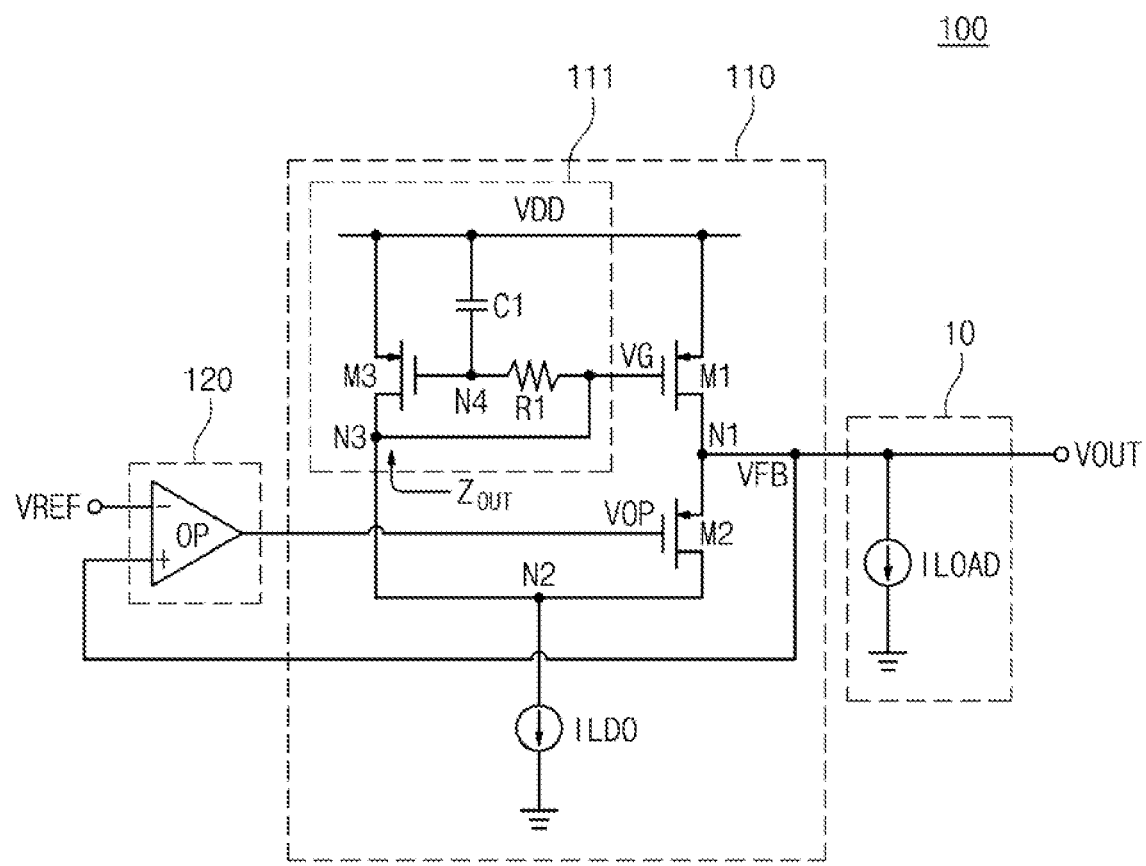
FIG. 1 is a circuit diagram illustrating a low dropout (LDO) regulator according to an example embodiment.

FIG. 1 is a circuit diagram illustrating a low dropout (LDO) regulator according to an example embodiment.

An LDO regulator 100 according to an example embodiment may include a flipped voltage follower 110 and an error amplifier 120.

The LDO regulator 100 may stably supply a voltage in response to a level of a current flowing to a system load 10. The system load 10 may include a load current bias ILOAD. That is, a level of a current flowing to the system load 10 may correspond to a level of a sink current of the load current bias ILOAD. The load current bias ILOAD may be variable.

The flipped voltage follower 110 may include first to third transistors M1 to M3, a first resistor R1, a first capacitor C1, and an LDO current source ILDO.

Each of the first to third transistors M1 to M3 may be, e.g., a p-channel metal-oxide-semiconductor (PMOS) transistor or an n-channel metal-oxide-semiconductor (NMOS) transistor. For convenience of description, the description will be given under the assumption that the first to third transistors M1 to M3 are PMOS transistors.

The first transistor M1 may be connected between a power supply voltage (VDD) terminal and a first node N1, and may operate in response to a pass gate voltage VG. The second transistor M2 may be connected between the first node N1 and a second node N2, and may operate in response to an OP amp output voltage VOP. The third transistor M3 may be connected between the power supply voltage (VDD) terminal and a third node N3, and may operate in response to a voltage of a fourth node N4. Here, a level of a voltage that the third node N3 has may be equal to a level of a voltage that the second node N2 has.

The first resistor R1 may be connected between the third node N3 and the fourth node N4.

The first capacitor C1 may be connected between the power supply voltage (VDD) terminal and the fourth node N4.

The LDO current source ILDO may be or provide a tail current having an arbitrary or given level. The LDO current source ILDO may be connected between the second node N2 and a ground voltage terminal.

The third transistor M3, the first capacitor C1, and the first resistor R1 may constitute an active inductor 111. The active inductor 111 may be implemented with the first capacitor C1 and the first resistor R1 in the case of a diode-connected PMOS transistor (i.e., in the case where a gate of the third transistor M3 is connected with the third node N3). An output impedance $Z_{OUT}$ of the active inductor 111 may follow a relationship of Equation 1 below.

In Equation 1, "$g_{m3}$" is defined as a transconductance of the third transistor M3; "C" is defined as a capacitance of the first capacitor C1; "R" is defined as a resistance value of the first resistor R1; "$r_{o3}$" is defined as a small-signal output resistance value of the third transistor M3; "s" is defined as a complex frequency. Compared to the case where an output impedance is "$(g_{m3})^{-1}$" when the gate of the third transistor M3 is directly connected with the third node N3, the output impedance $Z_{OUT}$ of the active inductor 111 increases as a frequency increases.

The error amplifier 120 may amplify a difference between a level of a reference voltage VREF and a level of a feedback voltage VFB, and may output the OP amp output voltage VOP. The error amplifier 120 may include an operational amplifier OP. Input terminals of the operational amplifier OP may be respectively connected with a reference voltage (VREF) terminal and the first node N1 (for VFB), and an output terminal thereof may be connected with a third terminal (the gate) of the second transistor M2. In detail, the operational amplifier OP may include a positive input terminal, a negative input terminal, and an output terminal. Although not illustrated, the operational amplifier OP may include a positive power terminal and a negative power terminal, and separate bias voltages may be respectively applied to the positive power terminal and the negative power terminal. The feedback voltage VFB may be applied to the positive input terminal of the operational amplifier OP, and the reference voltage VREF may be applied to the negative input terminal thereof.

According to an example embodiment, the LDO regulator 100 may be included in an electronic device (not illustrated). The electronic device (not illustrated) may include various electronic devices, which benefit from a stable voltage, such as a smartphone, a smart pad, a wearable device, a digital camera, a television, a monitor, a laptop computer, a black-box, and a robot. The electronic device (not illustrated) may correspond to the system load 10. The LDO regulator 100 may provide a stable voltage within a fast time in response to a sharp load change of the electronic device (not illustrated). As an example embodiment, a case where the electronic device is a memory device will be described in detail with reference to FIG. 14.

Figure 2:
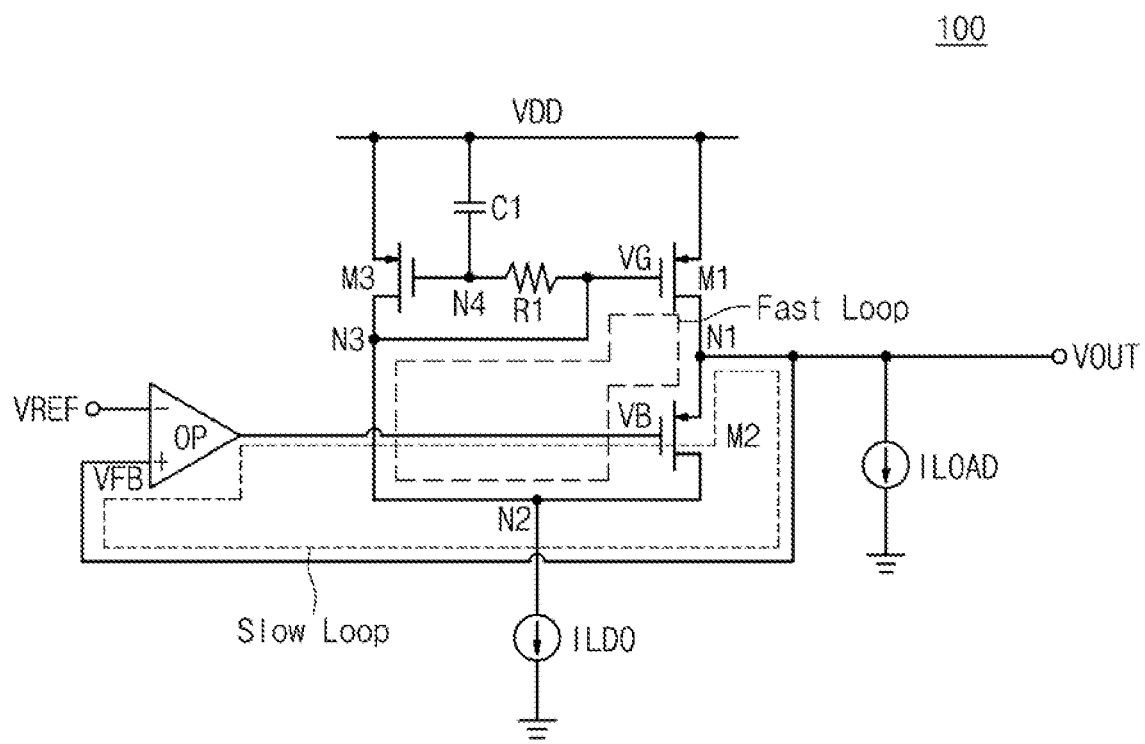
FIG. 2 is a circuit diagram illustrating a fast loop and a slow loop of an LDO regulator according to an example embodiment.

FIG. 2 is a circuit diagram illustrating a fast loop and a slow loop of an LDO regulator according to an example embodiment. The description given with reference to FIG. 1 will be omitted to avoid redundancy.

Referring to FIGS. 1 and 2, the fast loop may be implemented within the flipped voltage follower 110 of FIG. 1.

For a case in which a level of a current flowing to the system load 10 sharply increases, a level of an output voltage VOUT (i.e., a voltage of the first node N1) may instantaneously decrease. The output voltage VOUT having the decreased level may be input to a first terminal (e.g., a source) of the second transistor M2. The second transistor M2 may output the pass gate voltage VG through a second terminal (e.g., a drain) thereof. Because a level of the OP amp output voltage VOP input to the third terminal (e.g., a gate) of the second transistor M2 is fixed during the fast loop, the second transistor M2 may operate as a common gate amplifier. A voltage gain of the second transistor M2 operating as a common gate amplifier (i.e., a ratio of the pass gate voltage VG to the output voltage VOUT) may follow a relationship of Equation 2 below.

$$Z_{OUT} \approx \left(\frac{g_{m3} + sC}{sRC + 1} + \frac{1}{r_{o3}}\right)^{-1} \quad \text{[Equation 1]}$$

$$A_{V3} \approx g_{m2} * Z_{OUT} \approx g_{m2}\left(\frac{g_{m3} + sC}{sRC + 1} + \frac{1}{r_{o3}}\right)^{-1} \quad \text{[Equation 2]}$$

In Equation 2, $A_{V3}$ is defined as a voltage gain of the second transistor M2 operating as a common gate amplifier, and "$g_{m2}$" is defined as a transconductance of the second transistor M2. Accordingly, the voltage gain of the second transistor M2 operating as a common gate amplifier may approximate to a value of multiplying the transconductance of the second transistor M2 and the output impedance $Z_{OUT}$ of the active inductor 111 together. Accordingly, as the output impedance $Z_{OUT}$ increases, the voltage gain of the second transistor M2 operating as a common gate amplifier may increase.

Referring to Equation 1 and Equation 2, because the output impedance $Z_{OUT}$ of the active inductor 111 increases as a frequency becomes higher, a value of $A_{V3}$ may become greater as the frequency becomes higher.

Accordingly, in the above case where the level of the output voltage VOUT instantaneously decreases (i.e., in a situation where fluctuations of the output voltage VOUT is interpreted as a high frequency band), the second transistor M2 may output the pass gate voltage VG having a level sufficiently decreased by high $A_{V3}$. Because the first transistor M1 is driven by the pass gate voltage VG, the pass gate voltage VG having the decreased level may increase a level of a current flowing between a first terminal (e.g., a source) and a second terminal (e.g., a drain) of the first transistor M1 (i.e., through a channel of the first transistor M1). Accordingly, the output voltage VOUT having the instantaneously decreased level may be regulated to have a target voltage level (i.e., such that a level of the output voltage VOUT is increased). That is, the LDO regulator 100 may recover the level of the output voltage VOUT to the target level.

In contrast, for a case in which a level of a current flowing to the system load 10 sharply decreases, a level of the output voltage VOUT may instantaneously increase. The output voltage VOUT having the increased level may be input to the first terminal (e.g., a source) of the second transistor M2. The second transistor M2 may output the pass gate voltage VG having a level sufficiently increased by high $A_{V3}$. The pass gate voltage VG having the increased level may decrease a level of a current flowing between the first terminal (e.g., a source) and the second terminal (e.g., a drain) of the first transistor M1 (i.e., through the channel of the first transistor M1). Accordingly, the output voltage VOUT having the instantaneously increased level may be regulated to have the target voltage level (i.e., such that a level of the output voltage VOUT is decreased). That is, the LDO regulator 100 may recover the level of the output voltage VOUT to the target level.

By way of comparison to the LDO regulator 100, a comparative case (not illustrated) will be described in which the gate of the transistor M3 of FIG. 1 is directly connected with the third node N3 (i.e., the transistor M3 is diode-connected without the first capacitor C1 and the first resistor R1). In this comparative case, as the pass gate voltage VG fluctuates, a current flowing between a first terminal (e.g., a source) and a second terminal (e.g., a drain) of the third transistor M3 (i.e., through the channel of the third transistor M3) may fluctuate. For example, when the pass gate voltage VG increases, a current flowing between the first terminal and the second terminal (i.e., through the channel) of the third transistor M3 may decrease. In contrast, when the pass gate voltage VG decreases, a current flowing between the first terminal and the second terminal (i.e., through the channel) of the third transistor M3 may increase. Because the third transistor M3 is diode-connected, fluctuations of the current flowing between the first terminal and the second terminal (i.e., through the channel) may hinder fluctuations of the pass gate voltage VG.

Referring again to FIGS. 1 and 2, as described above, the LDO regulator 100 according to an example embodiment may include the first capacitor C1 and the first resistor R1. The first capacitor C1 and the first resistor R1 may operate as a low pass filter. Accordingly, in a situation where a level of the output voltage VOUT instantaneously increases or decreases (i.e., in a situation where fluctuations of the output voltage VOUT are interpreted as a high frequency band), a level of the pass gate voltage VG may also instantaneously increase or decrease. The instantaneous fluctuations of the pass gate voltage VG may be interpreted as a high frequency band. A high frequency component of a voltage of the fourth node N4, which is input to the gate of the third transistor M3, may not be passed by the low pass filter. Accordingly, even though a level of the output voltage VOUT instantaneously increases or decreases, a level of a current flowing between the first terminal (e.g., a source) and the second terminal (e.g., a drain) of the third transistor M3 (i.e., through the channel of the third transistor M3) may be uniform. Accordingly, the low pass filter may hinder the instantaneous fluctuations of the pass gate voltage VG. In other words, even though a level of the output voltage VOUT instantaneously increases or decreases, a level of a voltage input to the third terminal (e.g., a gate) of the third transistor M3 may be at a constant level.

Referring to FIGS. 1 and 2, the slow loop may be implemented by the second transistor M2 and the operational amplifier OP. The second transistor M2 may operate as a source follower.

For a case in which a level of a current flowing to the system load 10 sharply increases, a level of the output voltage VOUT may instantaneously decrease. Accordingly, a level of the feedback voltage VFB may also instantaneously decrease. The feedback voltage VFB having the decreased level may be input to the positive input terminal of the operational amplifier OP. The operational amplifier OP may amplify and output a difference between a level of the feedback voltage VFB and a level of the reference voltage VREF input to the negative input terminal. Accordingly, as a level of the feedback voltage VFB decreases, a level of the OP amp output voltage VOP may decrease. Because the second transistor M2 is driven by the OP amp output voltage VOP, the OP amp output voltage VOP having the decreased level may increase a level of a current flowing between a first terminal (e.g., a source) and a second terminal (e.g., a drain) of the second transistor M2 (i.e., through a channel of the second transistor M2). Accordingly, the output voltage VOUT having the instantaneously decreased level may be regulated to have a target voltage level (i.e., such that a level of the output voltage VOUT is increased). That is, the LDO regulator 100 may recover the level of the output voltage VOUT to the target level.

In contrast, for a case in which a level of a current flowing to the system load 10 sharply decreases, a level of the output voltage VOUT may instantaneously increase. Accordingly, a level of the feedback voltage VFB may also instantaneously increase. The feedback voltage VFB having the increased level may be input to the positive input terminal of the operational amplifier OP. Accordingly, as a level of the feedback voltage VFB increases, a level of the OP amp output voltage VOP may increase. Because the second transistor M2 is driven by the OP amp output voltage VOP, the OP amp output voltage VOP having the increased level may decrease a level of a current flowing between the first terminal (e.g., a source) and the second terminal (e.g., a drain) of the second transistor M2 (i.e., through the channel of the second transistor M2). Accordingly, the output voltage VOUT having the instantaneously increased level may be regulated to have the target voltage level. That is, the LDO regulator 100 may recover the level of the output voltage VOUT to the target level.

As a result, even though a level of a current flowing to the system load 10 changes, the LDO regulator 100 may operate depending on the fast loop and/or the slow loop, and thus, a level of the output voltage VOUT may be stably maintained as described above. In particular, the LDO regulator 100 may secure a wide bandwidth based on a high value of the output impedance $Z_{OUT}$ of the active inductor 111 in the fast loop. In other words, in terms of a bandwidth, the LDO regulator 100 may secure an additional zero. Accordingly, the LDO regulator 100 may quickly cope with a level change of the output voltage VOUT without an additional current supply (e.g., without an increase in a current level of the LDO current source ILDO).

On the other hand, according to another example embodiment, the LDO regulator 100 may secure a wide bandwidth by increasing a current level of the LDO current source ILDO. Accordingly, the LDO regulator 100 may quickly cope with a level change of the output voltage VOUT.

Figure 3:
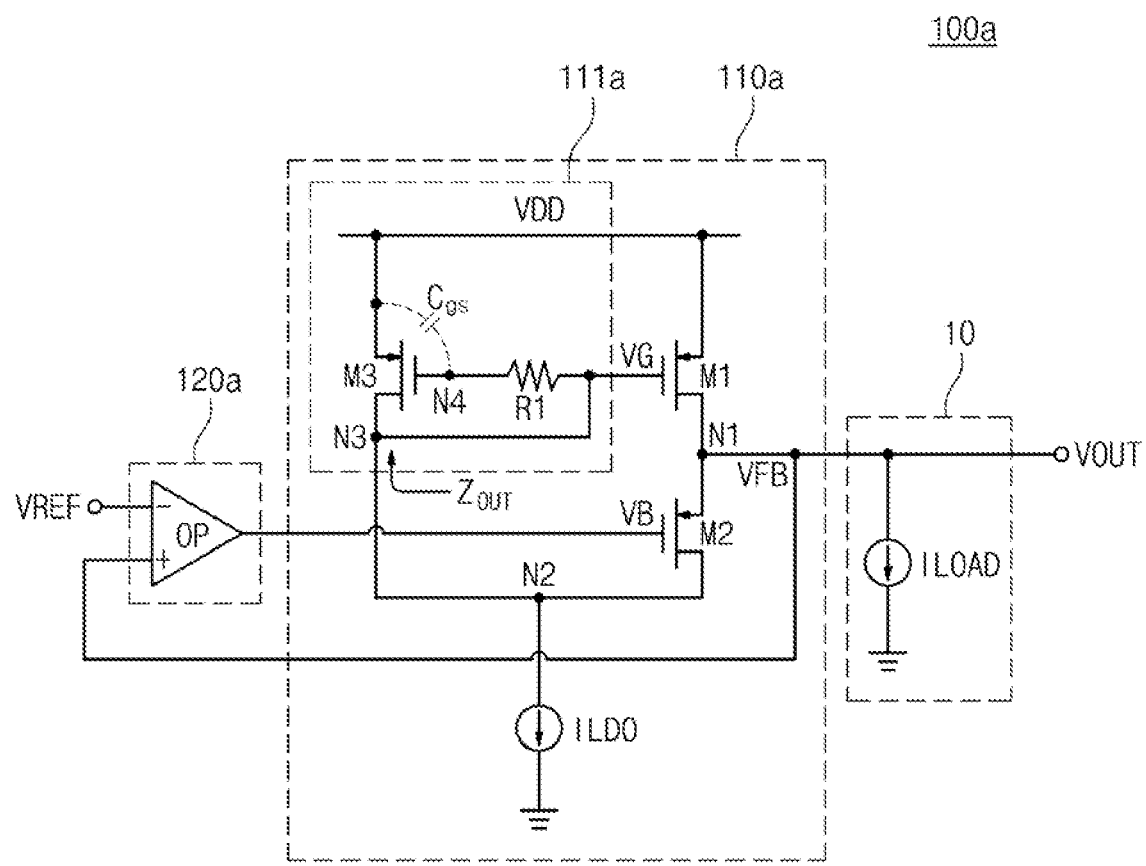
FIG. 3 is a circuit diagram illustrating an LDO regulator according to another example embodiment.

FIG. 3 is a circuit diagram illustrating an LDO regulator according to another example embodiment. For convenience, the description given with reference to FIGS. 1 and 2 will be omitted to avoid redundancy.

Referring to FIG. 3, an LDO regulator 100a according to an example embodiment may include a flipped voltage follower 110a having an active inductor 111a, and an error amplifier 120a. The error amplifier 120a may be the same as the error amplifier 120.

The active inductor 111a may include the third transistor M3 and the first resistor R1. The third transistor M3 may include a parasitic capacitance. For example, a parasitic capacitance between a first terminal (e.g., a source) and a third terminal (e.g., a gate) of the third transistor M3 may be a gate-source capacitance $C_{gs}$.

As compared to the active inductor 111 of FIG. 1, the gate-source capacitance $C_{gs}$ in the active inductor 111a may correspond to or take the place of the capacitance of the first capacitor C1 illustrated in FIG. 1. Accordingly, in the case where a capacitance required for the first capacitor C1 is small enough to be provided by the gate-source capacitance $C_{gs}$, the first capacitor C1 may be replaced with the gate-source capacitance $C_{gs}$ as in FIG. 3.

The degree of integration of a circuit constituting the LDO regulator 100a may be increased, e.g., relative to the LDO regulator 100, by replacing the first capacitor C1 with the parasitic capacitance of the third transistor M3. A function and an operation of the active inductor 111a in which the first capacitor C1 is replaced with the gate-source capacitance $C_{gs}$ are similar to the function and the operation of the active inductor 111 described with reference to FIGS. 1 and 2, and thus, additional description will be omitted to avoid redundancy.

Figure 4:
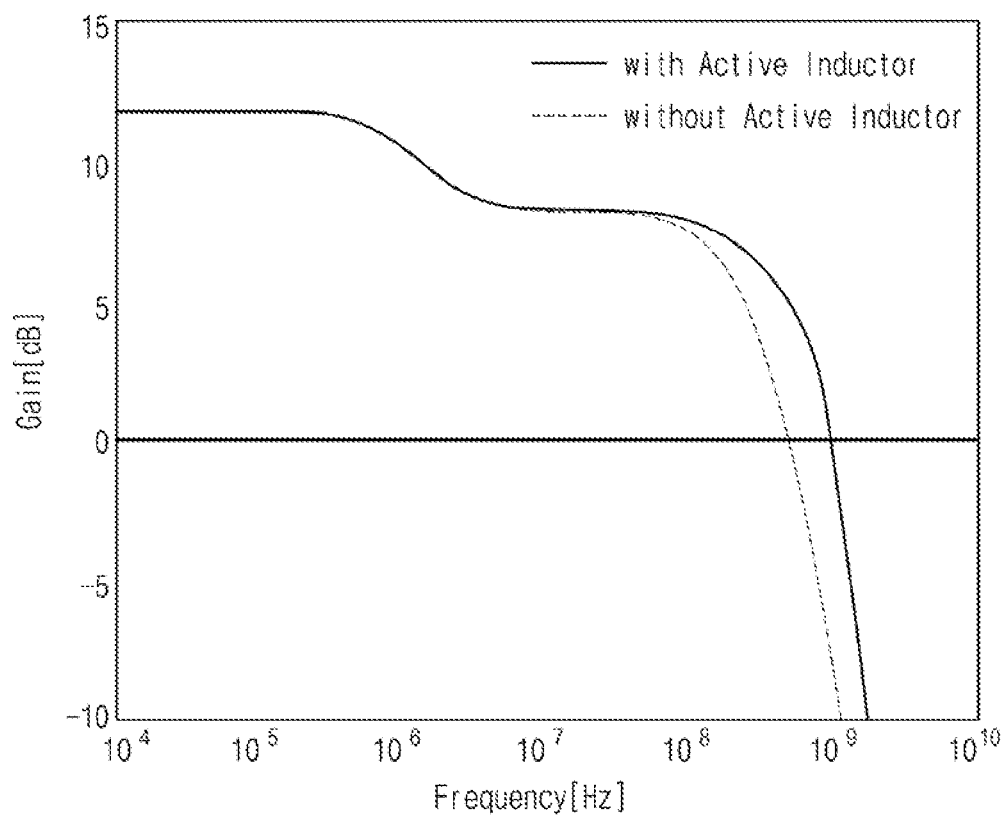
FIG. 4 is a graph illustrating a unit gain bandwidth of an LDO regulator according to an example embodiment, relative to a comparative example.

FIG. 4 is a graph illustrating a unit gain bandwidth of an LDO regulator according to an example embodiment, relative to a comparative example.

In FIG. 4, an x-axis represents a frequency expressed by a log unit, and a y-axis represents a gain of an LDO regulator. A solid line shows a gain according to a frequency of the LDO regulator 100 according to an example embodiment (i.e., in the case of including the active inductor 111). A broken line shows a gain according to a frequency of a comparative LDO regulator in which the gate of the third transistor M3 is directly connected with the third node N3 (not illustrated), i.e., in the case of a comparative LDO regulator that does not include the first capacitor C1 and the first resistor R1, that is, does not include the active inductor 111.

Referring to FIG. 4, it is confirmed that a unit gain bandwidth of the comparative LDO regulator indicated by the broken line is 458 MHz, whereas a unit gain bandwidth of the LDO regulator 100 according to an example embodiment is 893 MHz.

Accordingly, the LDO regulator 100 may stably supply the output voltage VOUT even in a relatively high frequency band. In other words, the LDO regulator 100 may quickly stabilize the output voltage VOUT with a fast transient response.

Figure 5:
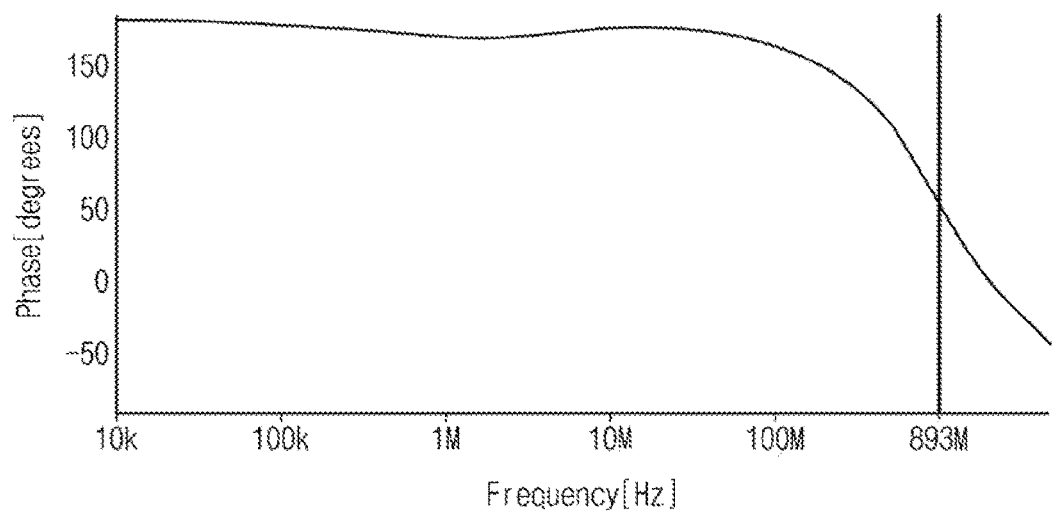
FIG. 5 is a graph illustrating a phase margin of an LDO regulator according to an example embodiment.

FIG. 5 is a graph illustrating a phase margin of an LDO regulator according to an example embodiment.

In FIG. 5, an x-axis represents a frequency expressed by a log unit, and a y-axis represents a phase of an output signal.

Referring to FIG. 5, a phase margin (i.e., a phase at a unit gain frequency) of the LDO regulator 100 according to an example embodiment is 52.6 degrees, and the LDO regulator 100 has a stable phase margin.

Figure 6:
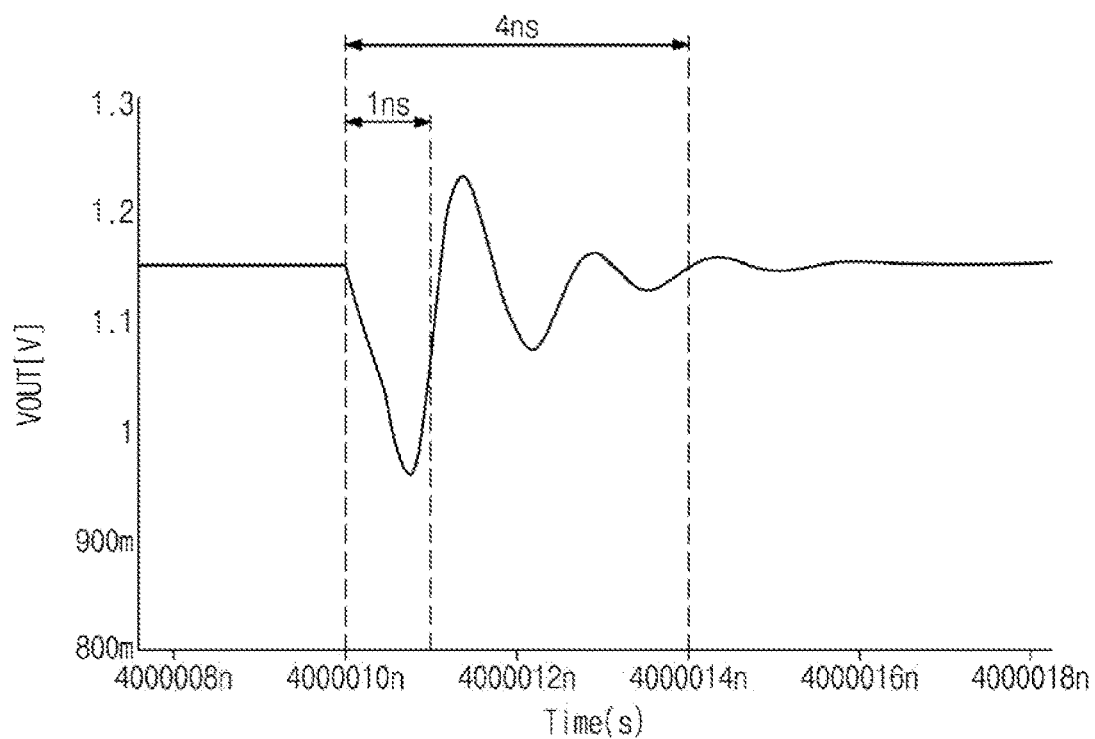
FIG. 6 is a graph illustrating a transient response of an LDO regulator according to an example embodiment.

FIG. 6 is a graph illustrating a transient response of an LDO regulator according to an example embodiment.

In FIG. 6, an x-axis represents a continuous time, and a y-axis represents a level of the output voltage VOUT.

Referring to FIG. 6, an initial level of the output voltage VOUT is 1.15 V. When a current flowing to the system load 10 sharply increases, as illustrated in FIG. 6, the level of the output voltage VOUT may also instantaneously decrease. When the level of the output voltage VOUT instantaneously decreases, a feedback loop (i.e., a fast loop) of the LDO regulator 100 may operate within 1 ns. The LDO regulator 100 may supply 1.15 V being the initial voltage level of the output voltage VOUT within 4 ns.

Figure 7:
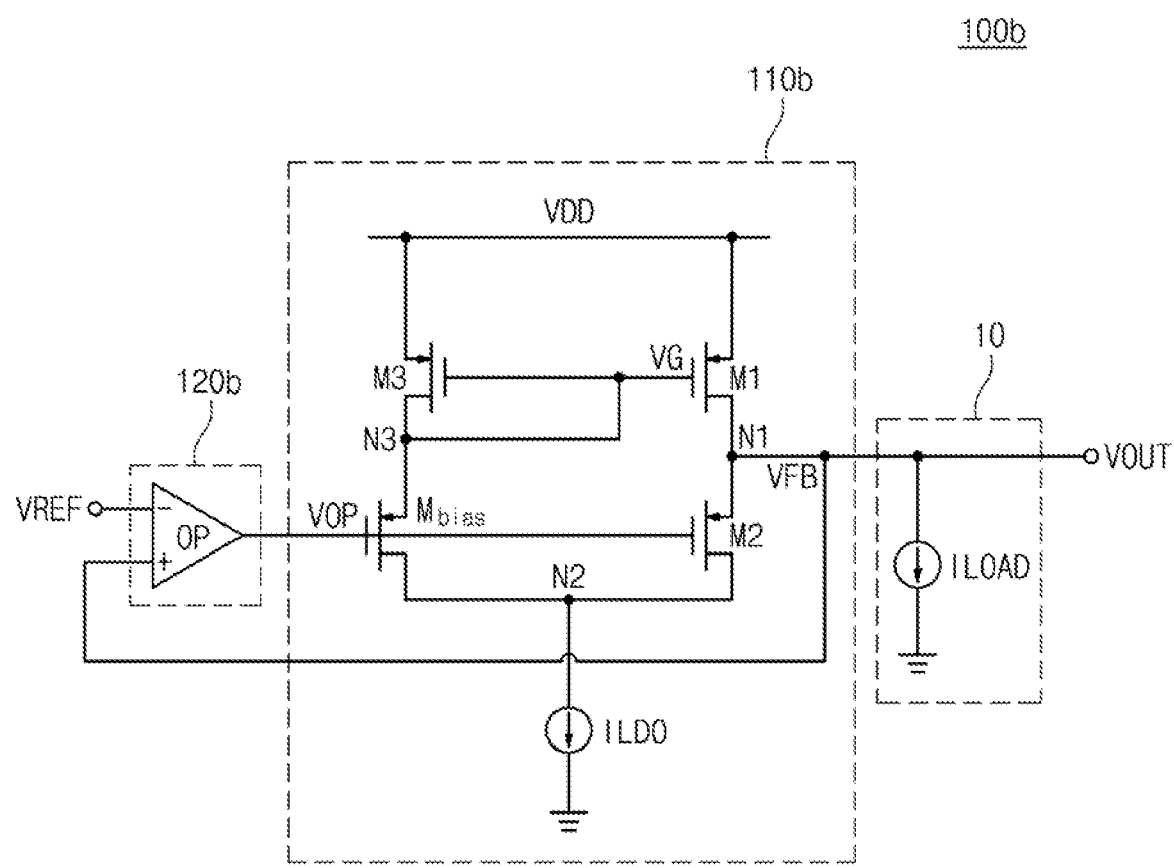
FIG. 7 is a circuit diagram illustrating an LDO regulator according to another example embodiment.

FIG. 7 is a circuit diagram illustrating an LDO regulator according to another example embodiment.

Referring to FIG. 7, an LDO regulator 100b may include a flipped voltage follower 110b and an error amplifier 120b. The error amplifier 120b may be the same as the error amplifier 120.

The LDO regulator 100b may stably supply a voltage in response to a level of a current flowing to the system load 10.

Functions and operations of the error amplifier 120b and the system load 10 are similar to the functions and the operations of the functions and the operations of the error amplifier 120 (refer to FIG. 1) and the system load 10 (refer to FIG. 1) described with reference to FIG. 1, and thus, additional description will be omitted to avoid redundancy.

The flipped voltage follower 110b may include first to third transistors M1 to M3, a bias transistor $M_{bias}$, and an LDO current source ILDO.

Functions and operations of the first to third transistors M1 to M3 and the LDO current source ILDO are similar to the functions and the operations of the functions and the operations of the first to third transistors M1 to M3 (refer to FIG. 1) and the LDO current source ILDO (refer to FIG. 1) described with reference to FIG. 1, and thus, additional description will be omitted to avoid redundancy.

The bias transistor $M_{bias}$ may be connected between the third node N3 and the second node N2, and may operate in response to the OP amp output voltage VOP. The bias transistor $M_{bias}$ may be, e.g., a PMOS or NMOS transistor.

The bias transistor $M_{bias}$ may prevent the second transistor M2 from operating in a triode region, not a saturation region, or from being turned off.

Figure 8A:
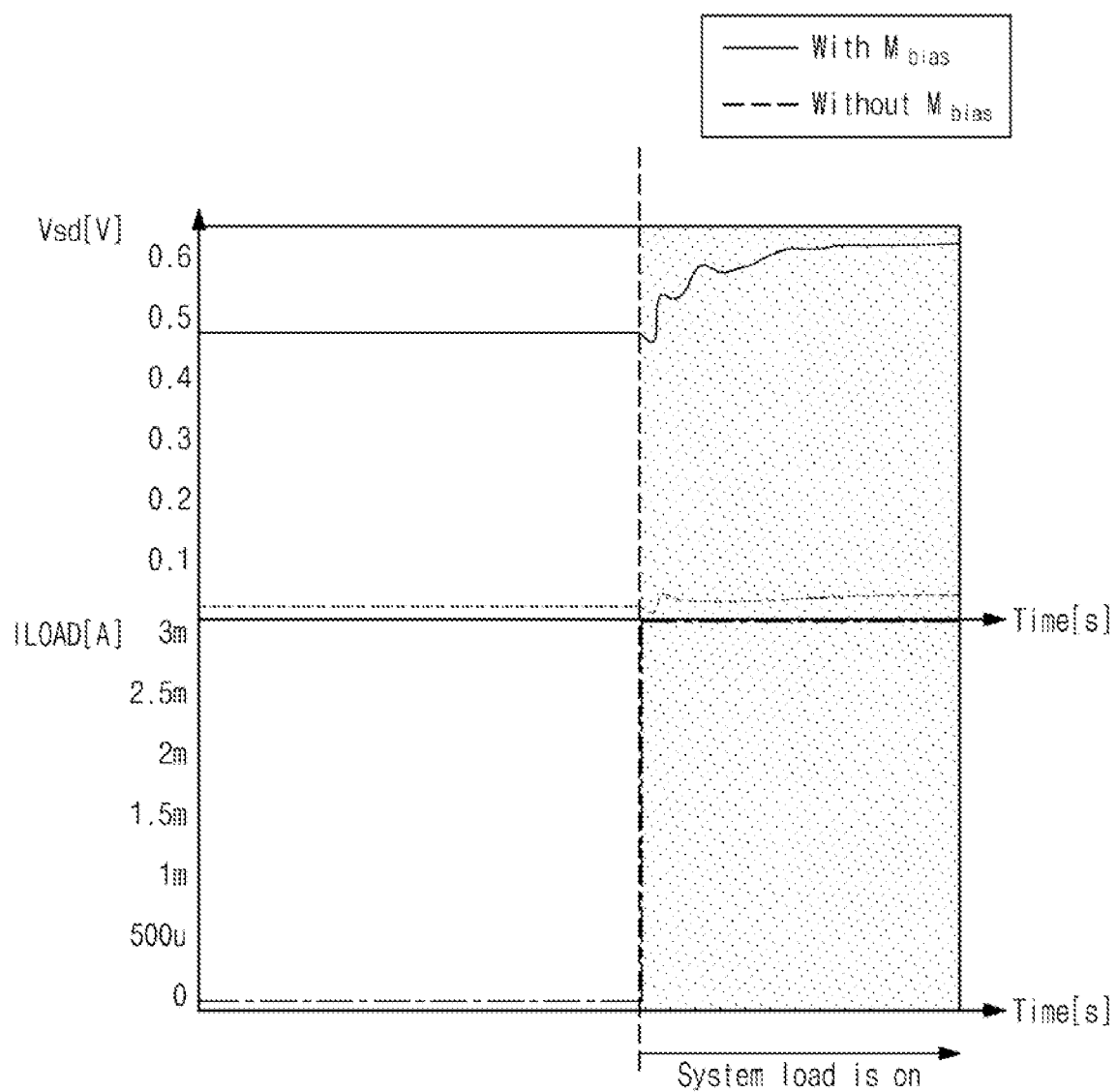
FIGS. 8A and 8B are graphs illustrating a source-drain voltage of a second transistor and an output voltage, according to an example embodiment and a comparative example.
Figure 8B:
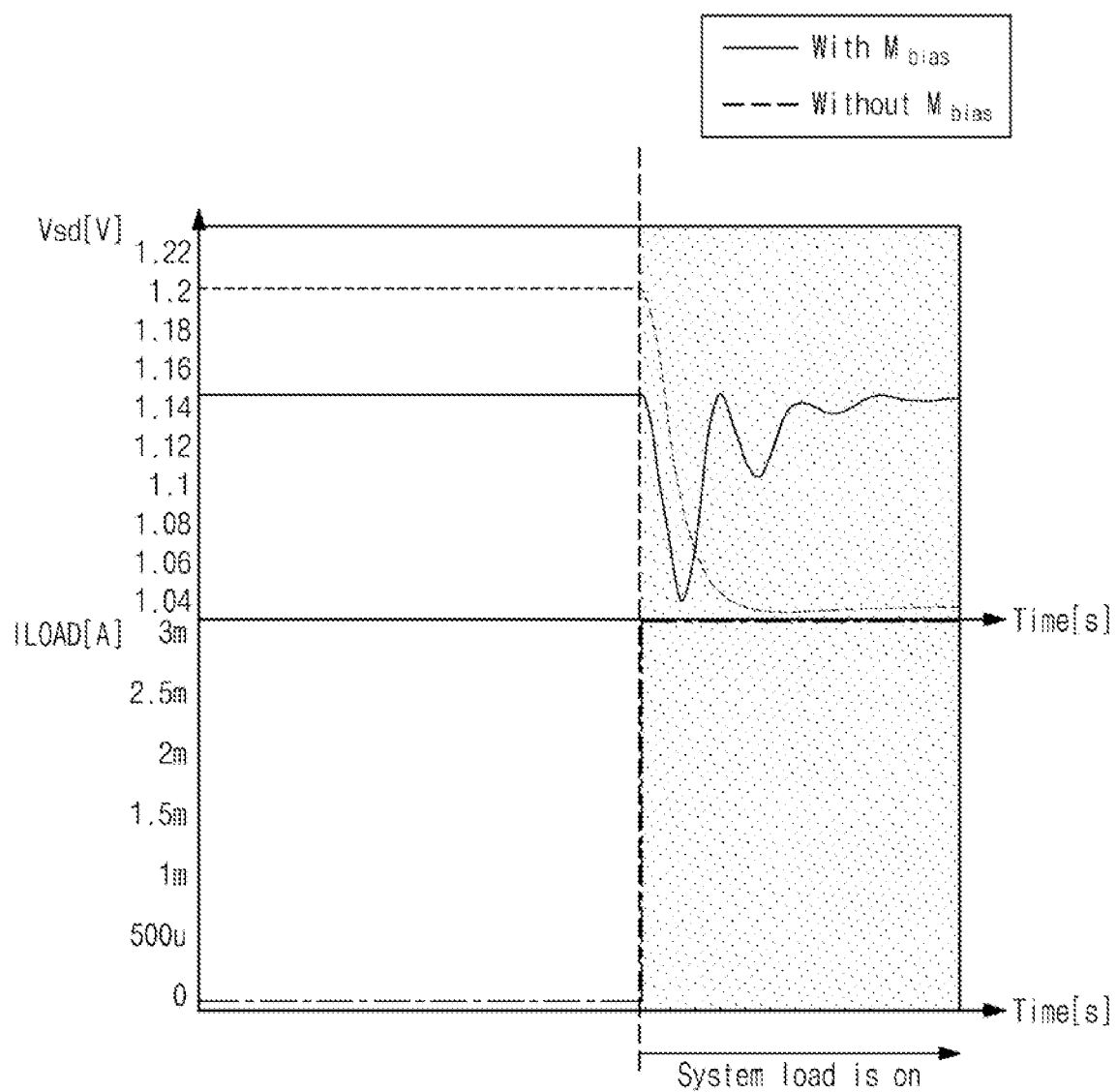

FIGS. 8A and 8B are graphs illustrating a source-drain voltage $V_{SD}$ of the second transistor M2 and the output voltage VOUT, according to an example embodiment and a comparative example.

In FIG. 8A, an x-axis represents an arbitrary continuous time, and a y-axis represents a level of a source-drain voltage $V_{SD}$ of the second transistor M2, as well as a current level by the load current bias ILOAD. A solid line indicates a level of the source-drain voltage $V_{SD}$ of the second transistor M2 included in the LDO regulator 100b according to an example embodiment. A broken line indicates a level of the source-drain voltage $V_{SD}$ of the second transistor M2 for a comparative example where the LDO regulator 100b of FIG. 7 does not include the bias transistor $M_{bias}$ (not illustrated), i.e., a case where the second node N2 and the third node N3 are directly connected. An alternated long and short dash line indicates a current level by the load current bias ILOAD.

Referring to FIG. 8A, after the indicated time at which the system load 10 is turned on, a level of the source-drain voltage $V_{SD}$ corresponding to the broken line (no bias transistor $M_{bias}$) may converge into about 30.6 mV, and in this case, the level of the source-drain voltage $V_{SD}$ may not be great enough for the second transistor M2 to operate in a saturation region.

In contrast, a level of the source-drain voltage $V_{SD}$ corresponding to the solid line (including bias transistor $M_{bias}$) may converge into about 619 mV, and in this case, the level of the source-drain voltage $V_{SD}$ may be great enough for the second transistor M2 to operate in a saturation region.

In FIG. 8B, an x-axis represents an arbitrary continuous time, and a y-axis represents a level of the output voltage VOUT, as well as a current level by the load current bias ILOAD. A solid line indicates a level of the output voltage VOUT included in the LDO regulator 100b according to an example embodiment. A broken line indicates a level of the output voltage VOUT for the comparative example where the LDO regulator 100b of FIG. 7 does not include the bias transistor $M_{bias}$ (not illustrated), i.e., in the case where the second node N2 and the third node N3 are directly connected. An alternated long and short dash line indicates a current level by the load current bias ILOAD.

Referring to FIG. 8B, after the indicated time at which the system load 10 is turned on, the second transistor M2 corresponding to the broken line (no bias transistor $M_{bias}$) may operate in a triode region. Accordingly, the comparative LDO regulator corresponding to the broken line may fail to supply the output voltage VOUT stably. It is confirmed that the output voltage VOUT of the comparative LDO regulator corresponding to the broken line fails to maintain about 1.204 V (which is an initial level) and converges into 1.04 V.

In contrast, the second transistor M2 included in the LDO regulator 100b corresponding to the solid line (including bias transistor $M_{bias}$) may operate in a saturation region stably. Accordingly, it is confirmed that the output voltage VOUT of the LDO regulator 100b corresponding to the solid line is recovered to about 1.15 V (which is an initial level) after a specific time point.

Figure 9A:
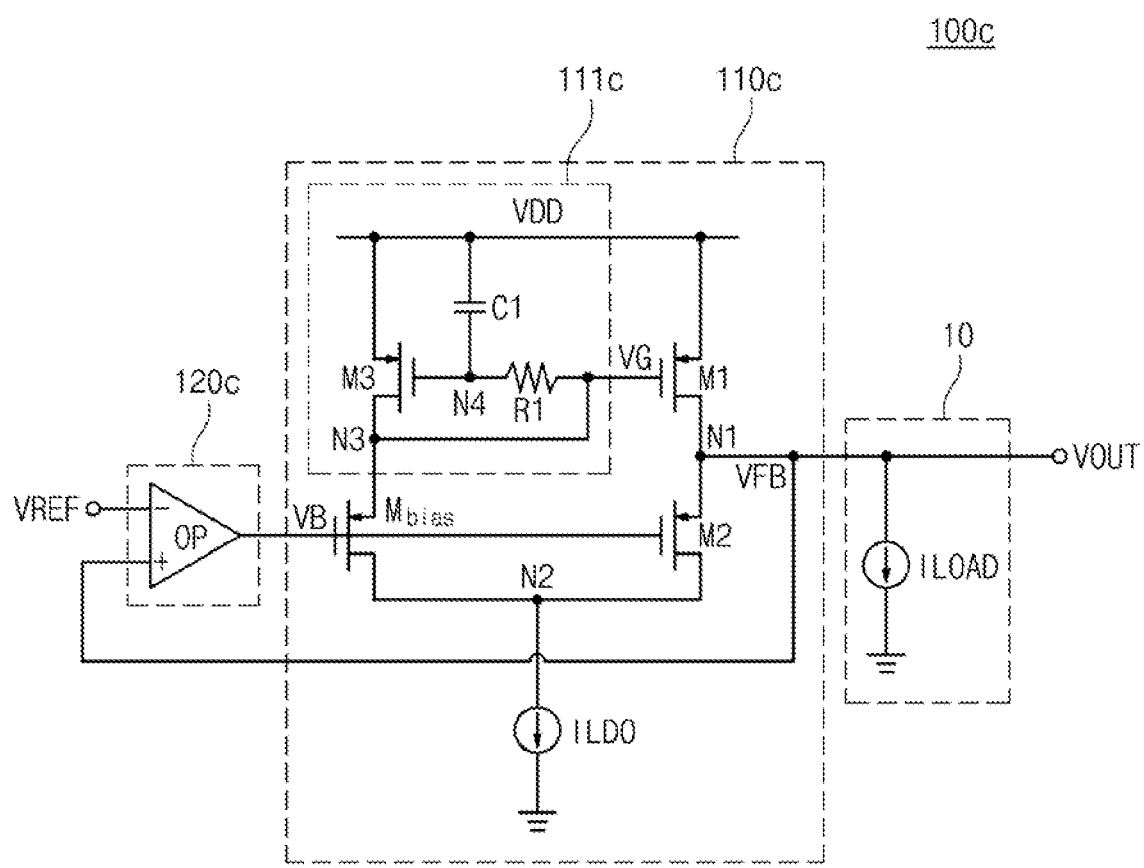
FIGS. 9A and 9B are circuit diagrams illustrating an LDO regulator according to other example embodiments.
Figure 9B:
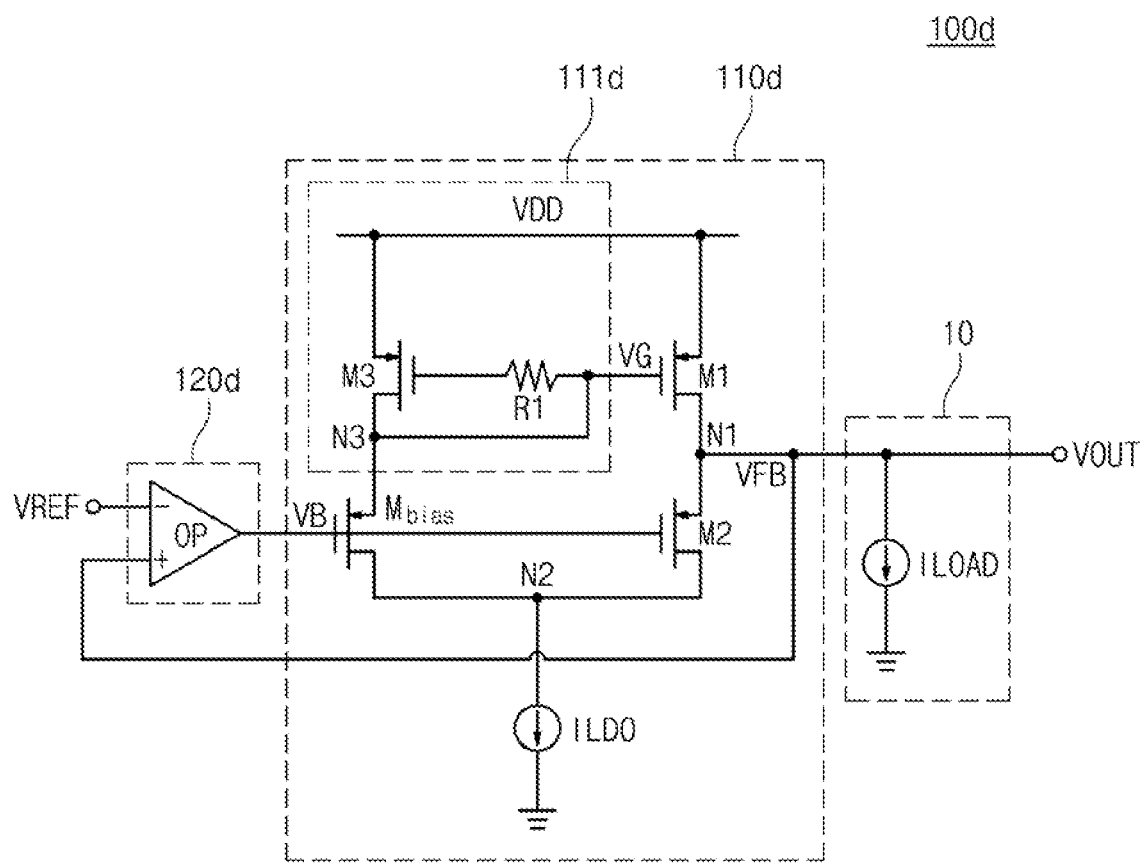

FIGS. 9A and 9B are circuit diagrams illustrating an LDO regulator according to other example embodiments.

By way of example, each of LDO regulators 100c and 100d of FIGS. 9A and 9B, respectively, may be similar to the LDO regulators 100 and 100a of FIGS. 1 and 3, respectively, while further including the bias transistor $M_{bias}$ FIG. 7. Thus, the description given with reference to FIGS. 1 to 3 and 7 will be omitted to avoid redundancy.

Referring to FIG. 9A, the LDO regulator 100c may include a flipped voltage follower 110c having an active inductor 111c, and an error amplifier 120c. The error amplifier 120c may be the same as the error amplifier 120.

Referring to FIG. 9B, the LDO regulator 100d may include a flipped voltage follower 110d having an active inductor 111d, and an error amplifier 120d. The error amplifier 120d may be the same as the error amplifier 120.

According to the example embodiments of FIGS. 9A and 9B, the flipped voltage followers 110c and 110d may each further include the bias transistor $M_{bias}$.

Comparing FIG. 9A to FIG. 9B, a gate-source capacitance of the third transistor M3 in FIG. 9B may replace the first capacitor C1 in FIG. 9A. Accordingly, in FIG. 9B, the active inductor 111d may be implemented with the third transistor M3 and the first resistor R1.

Figure 10A:
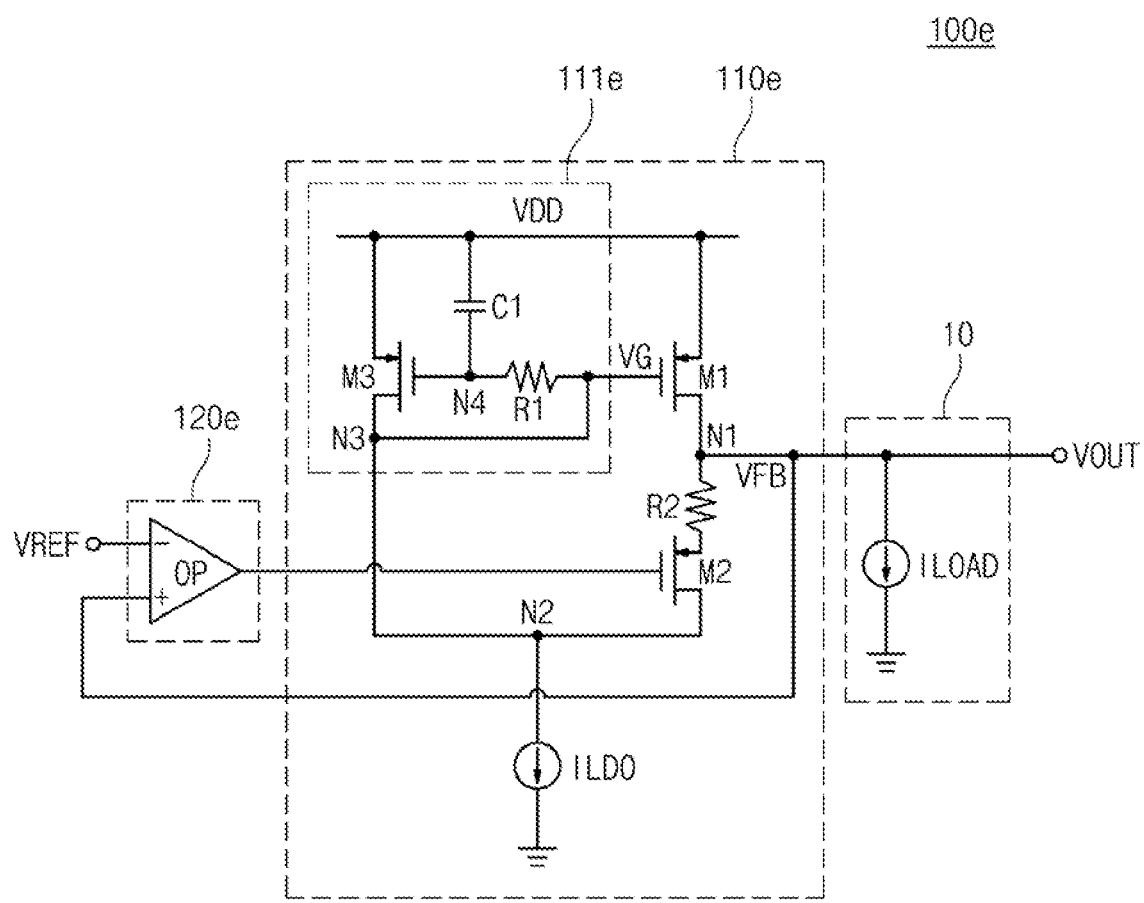
FIGS. 10A and 10B are circuit diagrams illustrating an LDO regulator according to other example embodiments.
Figure 10B:
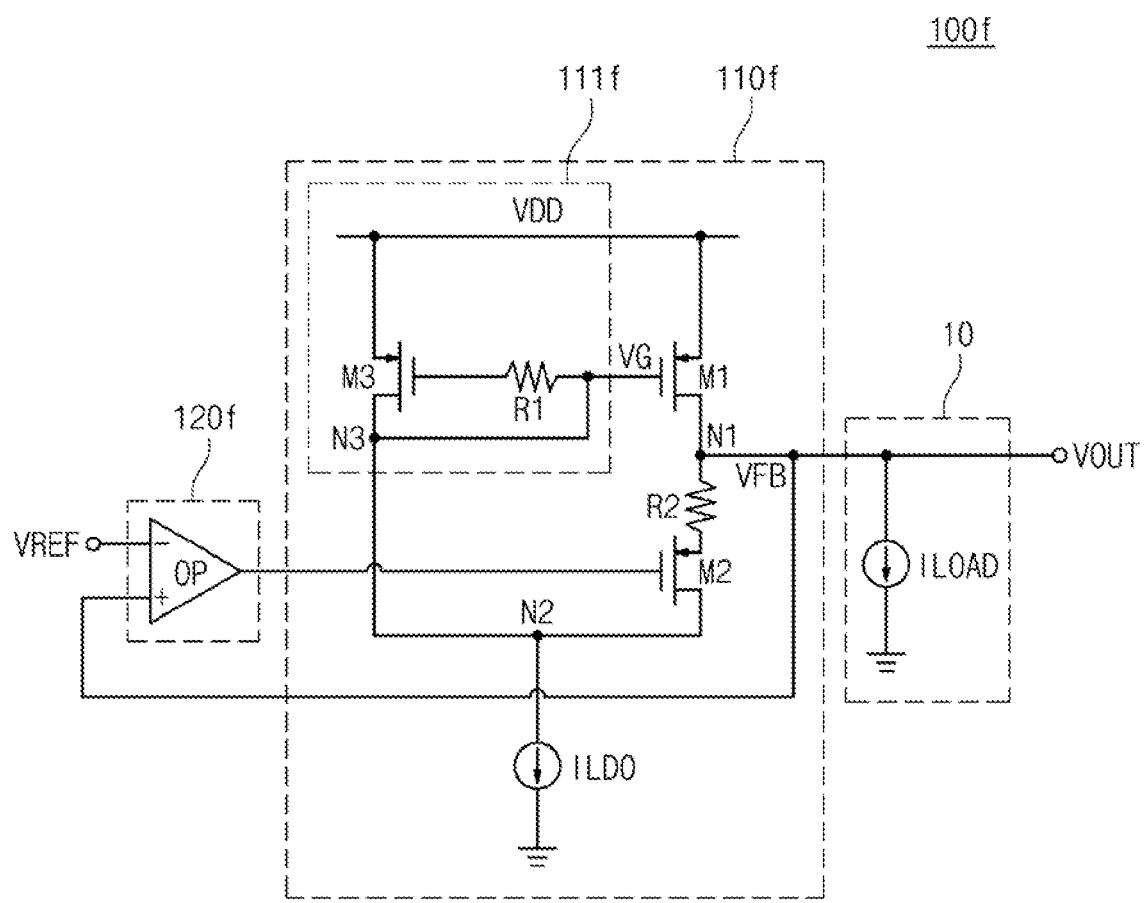

FIGS. 10A and 10B are circuit diagrams illustrating an LDO regulator according to other example embodiments.

By way of example, each of LDO regulators 100e and 100f of FIGS. 10A and 10B, respectively, may be similar to the LDO regulators 100 and 100a of FIGS. 1 and 3, respectively, while further including a second resistor R2. Thus, the description given with reference to FIGS. 1 to 3 will be omitted to avoid redundancy.

Referring to FIG. 10A, the LDO regulator 100e may include a flipped voltage follower 110e having an active inductor 111e, and an error amplifier 120e. The error amplifier 120e may be the same as the error amplifier 120.

Referring to FIG. 10B, the LDO regulator 100f may include a flipped voltage follower 110f having an active inductor 111f, and an error amplifier 120f. The error amplifier 120f may be the same as the error amplifier 120.

According to the example embodiments of FIGS. 10A and 10B, the flipped voltage followers 110e and 110f may each further include the second resistor R2. The second resistor R2 may be connected between the first node N1 and the first terminal (e.g., a source) of the second transistor M2. Accordingly, when the fast loop of the LDO regulators 100e and 100f operates due to a sharp increase or a sharp decrease in the output voltage VOUT, a voltage that is input to the first terminal of the second transistor M2 may be dropped by the second resistor R2. A value of the second resistor R2 may be variable or may be set to an arbitrary or given value.

Comparing FIG. 10A to FIG. 10B, a gate-source capacitance of the third transistor M3 in FIG. 10B may replace the first capacitor C1 in FIG. 10A. Accordingly, in FIG. 10B, the active inductor 111f may be implemented with the third transistor M3 and the first resistor R1.

Figure 11A:
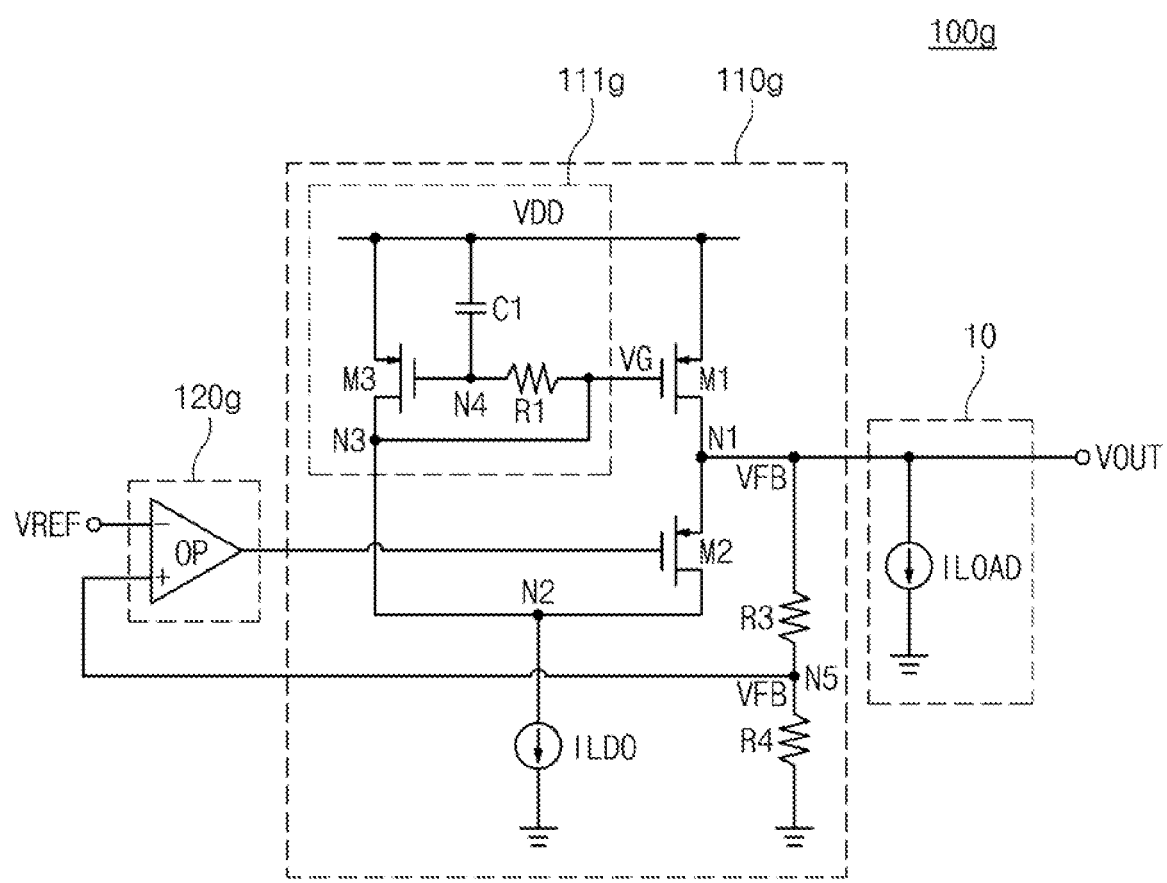
FIGS. 11A and 11B are circuit diagrams illustrating an LDO regulator according to other example embodiments.
Figure 11B:
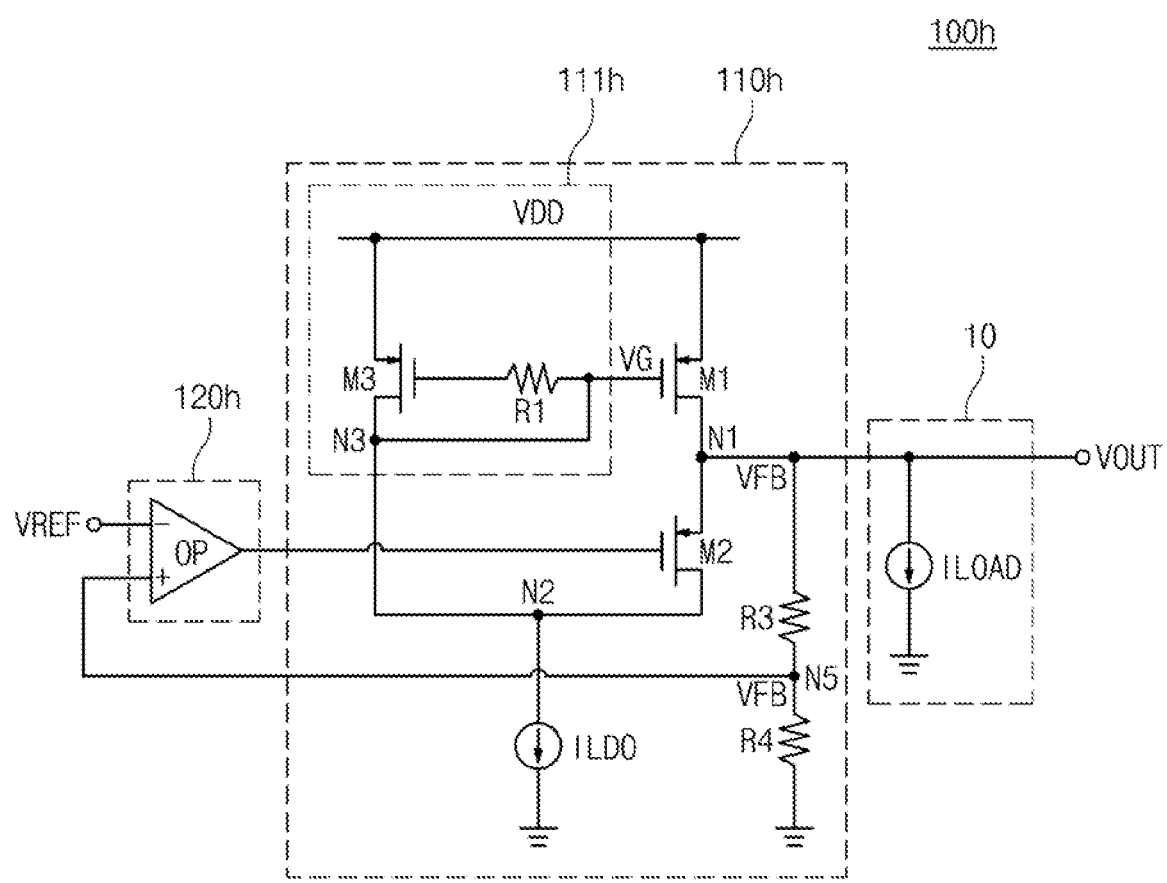

FIGS. 11A and 11B are circuit diagrams illustrating an LDO regulator according to other example embodiments.

By way of example, each of LDO regulators 100g and 100h of FIGS. 11A and 11B, respectively, may be similar to the LDO regulators 100 and 100a of FIGS. 1 and 3, respectively, while further including a third resistor R3 and a fourth resistor R4. Thus, the description given with reference to FIGS. 1 to 3 will be omitted to avoid redundancy.

Referring to FIG. 11A, the LDO regulator 100g may include a flipped voltage follower 110g having an active inductor 111g, and an error amplifier 120g. The error amplifier 120g may be the same as the error amplifier 120.

Referring to FIG. 11B, the LDO regulator 100h may include a flipped voltage follower 110h having an active inductor 111h, and an error amplifier 120h. The error amplifier 120h may be the same as the error amplifier 120.

According to the example embodiments of FIGS. 11A and 11B, the flipped voltage followers 110g and 110h may each further include the third resistor R3 and the fourth resistor R4. The third resistor R3 may be connected between the first node N1 and a fifth node N5 (i.e., a voltage division node), and the fourth resistor R4 may be connected between the fifth node N5 and a ground node. The third resistor R3 and the fourth resistor R4 may divide the output voltage VOUT, and the divided voltage, that is, a voltage of the fifth node N5 (i.e., the feedback voltage VFB) may be transferred to the positive input terminal of the operational amplifier OP.

Comparing FIG. 11A to FIG. 11B, a gate-source capacitance of the third transistor M3 in FIG. 11B may replace the first capacitor C1 in FIG. 11A. Accordingly, the active inductor 111h may be implemented with the third transistor M3 and the first resistor R1.

Figure 12A:
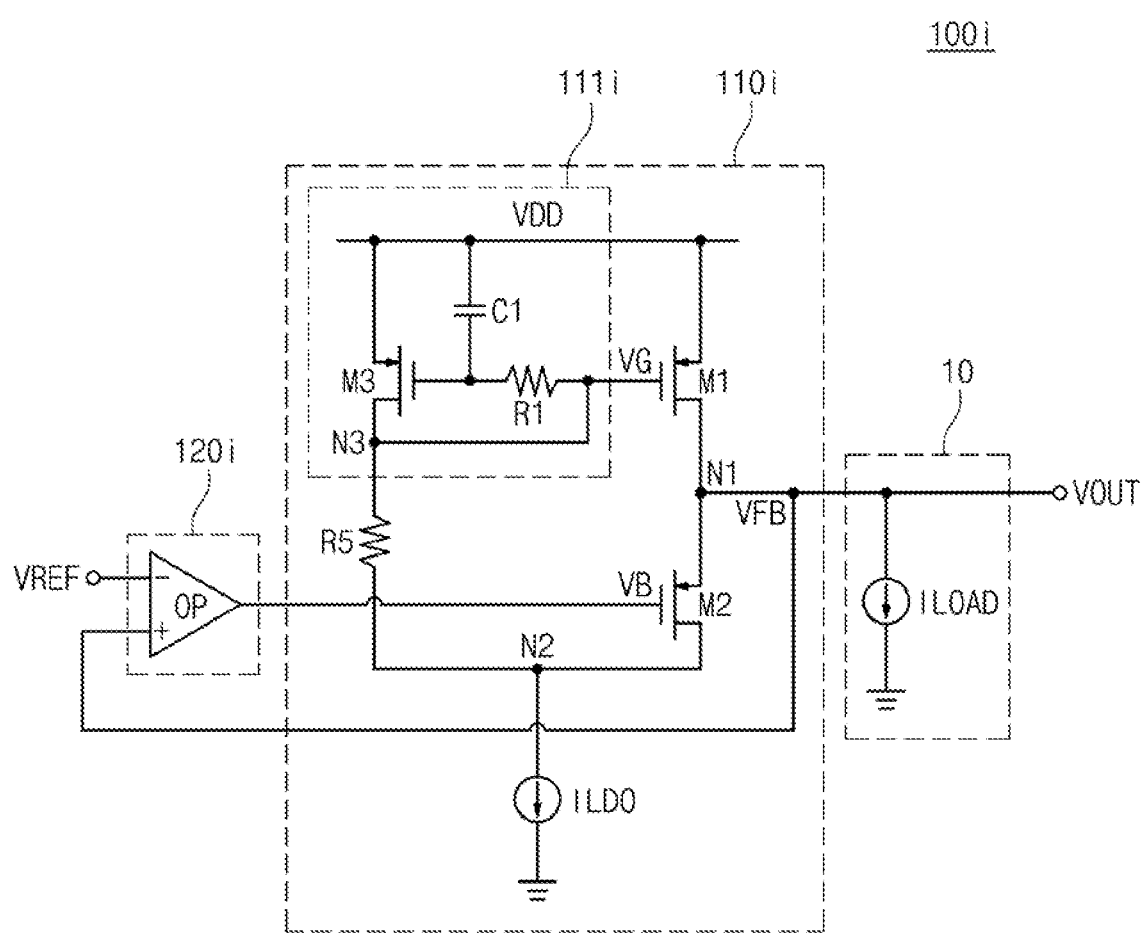
FIGS. 12A and 12B are circuit diagrams illustrating an LDO regulator according to other example embodiments.
Figure 12B:
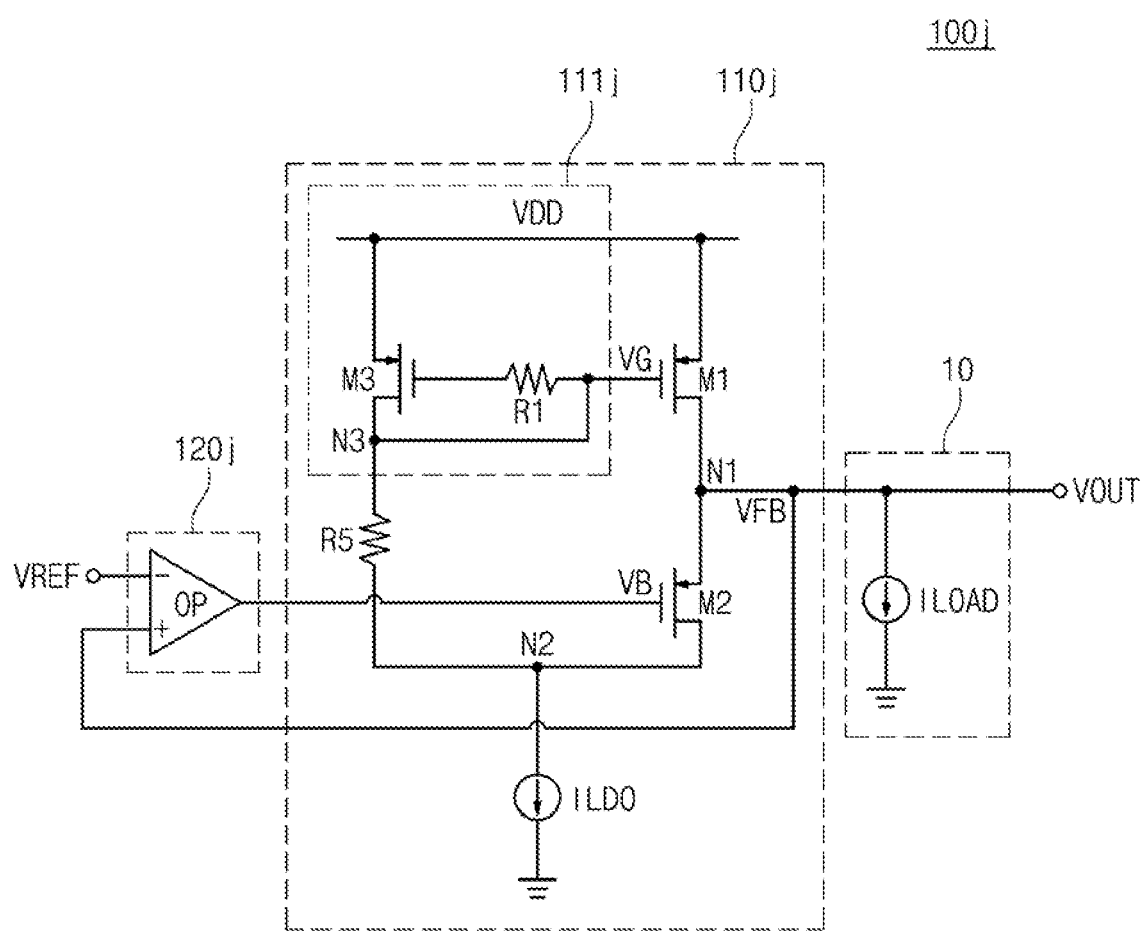

FIGS. 12A and 12B are circuit diagrams illustrating an LDO regulator according to other example embodiments.

By way of example, each of LDO regulators 100i and 100j of FIGS. 12A and 12B, respectively, may be similar to the LDO regulators 100 and 100a of FIGS. 1 and 3, respectively, while further including a fifth resistor R5. Thus, the description given with reference to FIGS. 1 to 3 will be omitted to avoid redundancy.

Referring to FIG. 12A, the LDO regulator 100i may include a flipped voltage follower 110i having an active inductor 111i, and an error amplifier 120i. The error amplifier 120i may be the same as the error amplifier 120.

Referring to FIG. 12B, the LDO regulator 100j may include a flipped voltage follower 110j having an active inductor 111j, and an error amplifier 120j. The error amplifier 120j may be the same as the error amplifier 120.

According to the example embodiments of FIGS. 12A and 12B, the flipped voltage followers 110i and 110j may each further include the fifth resistor R5. The fifth resistor R5 may be connected between the second node N2 and the third node N3. When the fast loop of the LDO regulators 100i and 100j operates due to a sharp increase or a sharp decrease in the output voltage VOUT, a voltage that is input to the second terminal (e.g., a drain) of the second transistor M2 may be dropped by the fifth resistor R5. Accordingly, a voltage level that the second node N2 has may differ from a voltage level that the third node N3 has. A value of the fifth resistor R5 may be variable or may be set to an arbitrary or given value.

Comparing FIG. 12A to FIG. 12B, a gate-source capacitance of the third transistor M3 in FIG. 12B may replace the first capacitor C1 in FIG. 12A. Accordingly, the active inductor 111j may be implemented with the third transistor M3 and the first resistor R1.

Figure 13A:
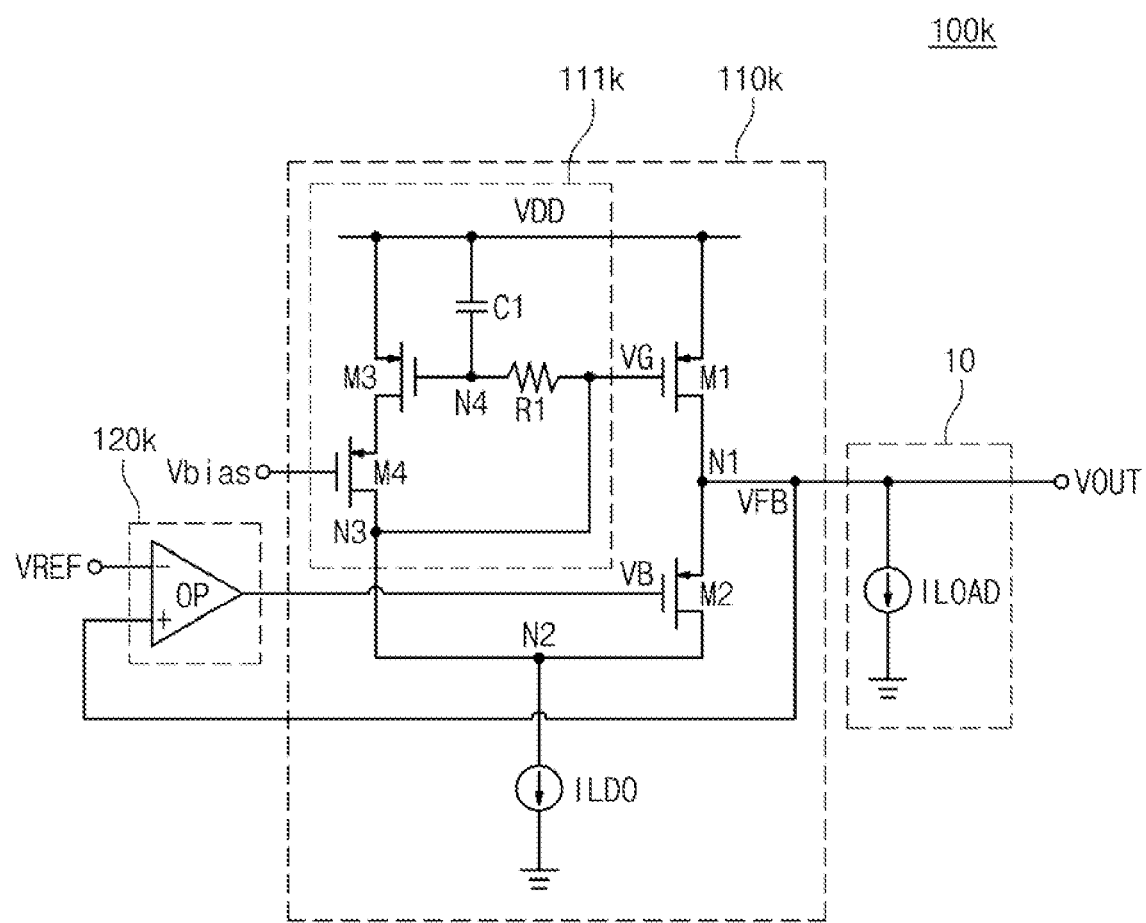
FIGS. 13A and 13B are circuit diagrams illustrating an LDO regulator according to other example embodiments.
Figure 13B:
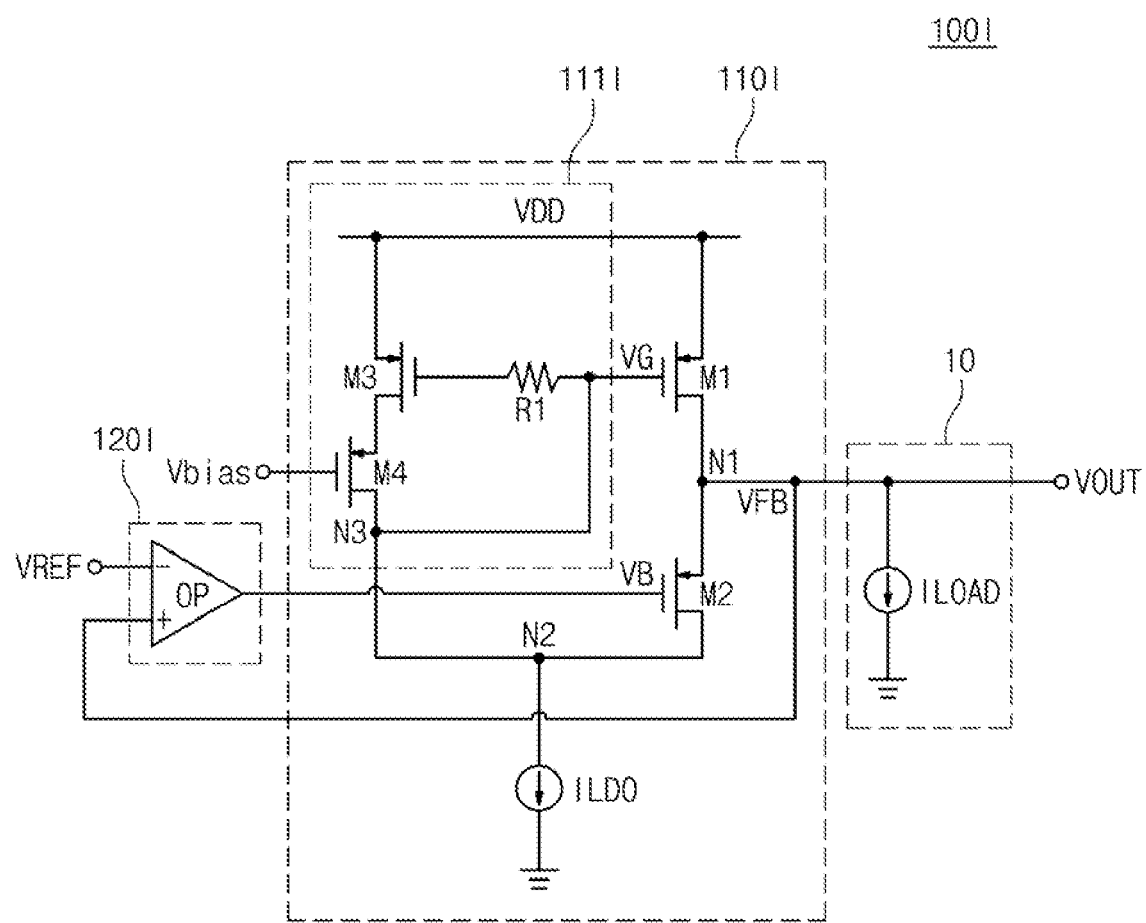

FIGS. 13A and 13B are circuit diagrams illustrating an LDO regulator according to other example embodiments.

By way of example, each of LDO regulators 100k and 100l of FIGS. 13A and 13B, respectively, may be similar to the LDO regulators 100 and 100a of FIGS. 1 and 3, respectively, while further including a fourth transistor M4. Thus, the description given with reference to FIGS. 1 to 3 will be omitted to avoid redundancy.

Referring to FIG. 13A, the LDO regulator 100k may include a flipped voltage follower 110k having an active inductor 111k, and an error amplifier 120k. The error amplifier 120k may be the same as the error amplifier 120.

Referring to FIG. 13B, the LDO regulator 100l may include a flipped voltage follower 110l having an active inductor 111l, and an error amplifier 120l. The error amplifier 120l may be the same as the error amplifier 120.

According to the example embodiments of FIGS. 13A and 13B, the flipped voltage followers 110k and 110l may each further include the fourth transistor M4. The fourth transistor M4 may be, e.g., a PMOS or NMOS transistor. For convenience of description, the description will be given under the assumption that the fourth transistor M4 is a PMOS transistor. The fourth transistor M4 may be connected between the second terminal (e.g., a drain) of the third transistor M3 and the third node N3, and may operate in response to a bias voltage Vbias, e.g., from a bias voltage terminal. A level of the bias voltage Vbias may be variable or may be set to an arbitrary or given value. The fourth transistor M4 may regulate a voltage of the third node N3 based on the bias voltage Vbias.

Comparing FIG. 13A to FIG. 13B, a gate-source capacitance of the third transistor M3 in FIG. 13B may replace the first capacitor C1 in FIG. 13A. Accordingly, the active inductor 111l may be implemented with the third transistor M3 and the first resistor R1.

In additional example embodiments, different from the above-described example embodiments illustrated in FIGS. 9A to 13B, the LDO regulator 100 may be implemented with various combinations including at least one of the bias transistor $M_{bias}$, the third and fourth resistors R3 and R4, the fifth resistor R5, and the fourth transistor M4. In other implementations, the LDO regulator 100 may further include one or more passive or active elements.

Figure 14:
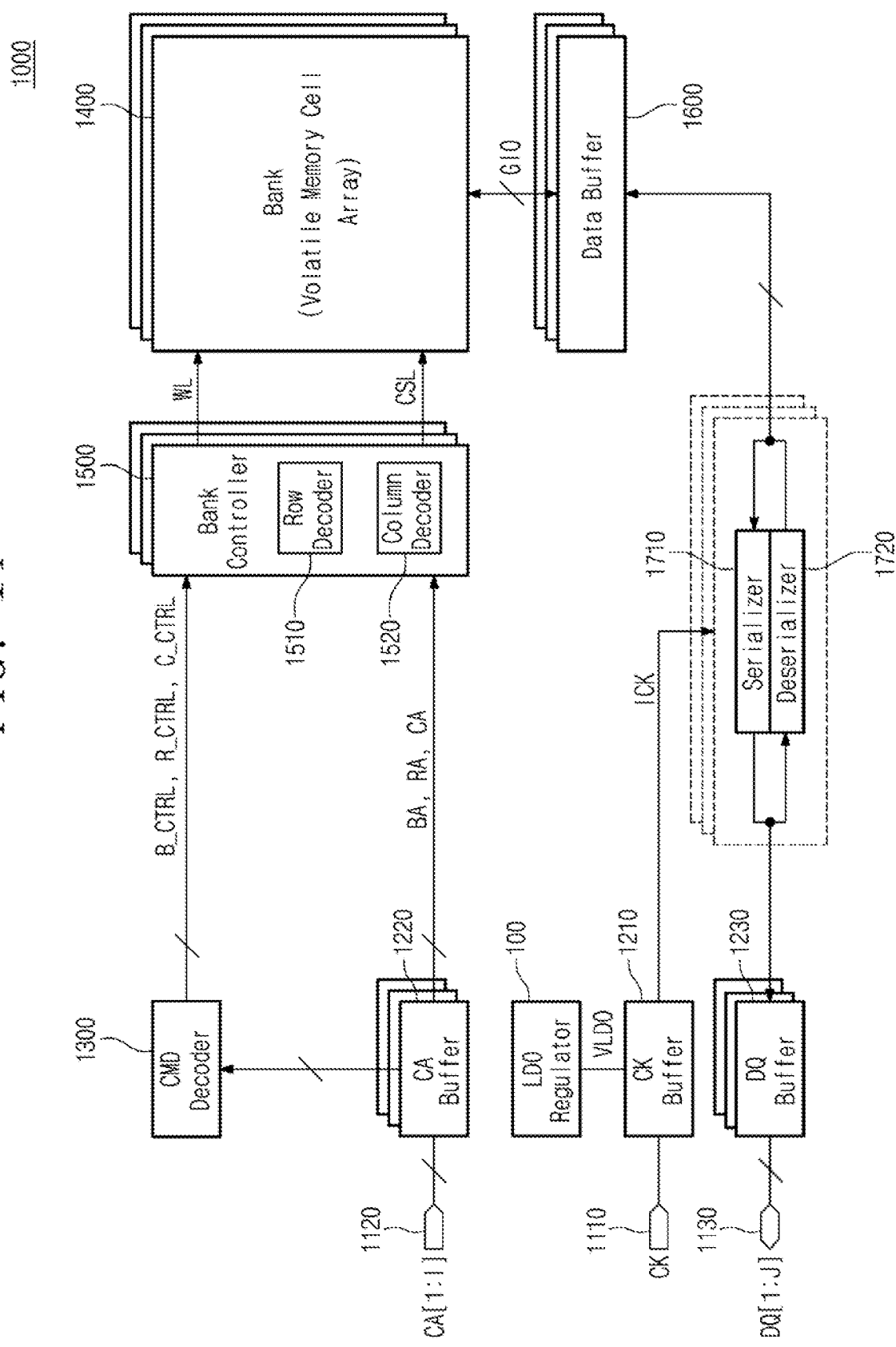
FIG. 14 is a block diagram illustrating a memory device according to an example embodiment.

FIG. 14 is a block diagram illustrating a memory device according to an example embodiment.

Referring to FIG. 14, a memory device 1000 may include at least one memory chip. FIG. 14 shows the memory device 1000 including one memory chip as an example, but this may be varied.

The memory chip may be, e.g., a volatile memory chip, that is, a dynamic random access memory (DRAM) chip. For example, the DRAM chip may be a general-purpose DRAM chip, such as a double data rate synchronous dynamic random access memory (DDR SDRAM) chip, a DDR2 SDRAM chip, a DDR3 SDRAM chip, a DDR4 SDRAM chip, a DDR5 SDRAM chip, or the like, a DRAM chip for a mobile application, such as a low power double data rate (LPDDR) SDRAM chip, an LPDDR2 SDRAM chip, an LPDDR3 SDRAM chip, an LPDDR4 SDRAM chip, an LPDDR4X SDRAM chip, an LPDDR5 SDRAM chip, or the like, or a DRAM chip providing a high bandwidth, such as a graphics double data rate (GDDR) synchronous graphics random access memory (SGRAM) chip, a GDDR2 SGRAM chip, a GDDR3 SGRAM chip, a GDDR4 SGRAM chip, a GDDR5 SGRAM chip, a GDDR6 SGRAM chip, a high bandwidth memory (HBM) chip, a HBM2 chip, a HBM3 chip, a WideIO SDRAM chip, or the like.

The memory device 1000 may include a clock (CK) pin 1110, a command and address (CA) pin 1120, DQ pins 1130, a clock buffer 1210 (CK buffer), a CA buffer 1220, a command decoder 1300, banks 1400, bank controllers 1500, data buffers 1600, a serializer 1710, and a deserializer 1720.

The clock pin 1110 may be a terminal of receiving a clock signal CK from the outside of the memory device 1000 (e.g., from a host or a memory controller). The clock signal CK may be a unidirectional signal that is input only to the memory device 1000, and the clock pin 1110 may be an input terminal. For convenience of description, only one clock pin 1110 is illustrated. However, the memory device 1000 may receive differential clock signals, and the memory device 1000 may further include a clock pin of receiving a clock signal (e.g., CKb) having a phase opposite to that of the clock signal CK input through the clock pin 1110.

The CA pins 1120 may be terminals of receiving CA signals CA[1:I] from the outside of the memory device 1000. The number of CA pins 1120 and the number of CA signals CA[1:I] may be "I", that is, may be identical to each other. Here, "I" may be a natural number and may be in advance determined in compliance with various protocols. The CA signals CA[1:I] may include a command for controlling the memory device 1000 and an address indicating a location of memory cells in the banks 1400. The CA signals CA[1:I] may be unidirectional signals that are input only to the memory device 1000, and the CA pins 1120 may be input terminals.

The DQ pins 1130 may be terminals of receiving DQ signals DQ[1:J] from the outside of the memory device 1000 or outputting the DQ signals DQ[1:J] to the outside of the memory device 1000. The number of DQ pins 1130 and the number of DQ signals DQ[1:J] may be "J", that is, may be identical to each other. Here, "J" may be a natural number and may be in advance determined in compliance with various protocols. The DQ signals DQ[1:J] may include write data associated with a write command or read data associated with a read command. The DQ signals DQ[1:J] may be bidirectional signals that are input to the memory device 1000 or are output from the memory device 1000, and the DQ pins 1130 may be input/output terminals.

The clock buffer 1210 may operate as a receiver (RX) that receives the clock signal CK. The clock buffer 1210 may receive the clock signal CK and may output an internal clock signal ICK to the inside of the memory device 1000. The internal clock signal ICK is illustrated in FIG. 14 as being output only to the serializer 1710 and the deserializer 1720. However, the internal clock signal ICK may also be output to various components of the memory device 1000. According to an example embodiment, the clock buffer 1210 may operate based on an LDO output voltage VLDO that the LDO regulator 100 outputs. In this case, even though the clock buffer 1210 operates at a high speed due to a high frequency of the clock signal CK or the internal clock signal ICK, the clock buffer 1210 may stably output the internal clock signal ICK.

The CA buffers 1220 may operate as receivers that receive the CA signals CA[1:I].

The number of CA buffers 1220 may be identical to the number of CA pins 1120. The CA buffers 1220 may sample or latch the CA signals CA[1:I] at a rising edge or a falling edge of the internal clock signal ICK. The CA buffers 1220 may transmit signals, which correspond to a command, from among the received CA signals CA[1:I] to the command decoder 1300. The CA buffers 1220 may transmit signals, which correspond to an address, from among the received CA signals CA[1:I] to the bank controllers 1500. Locations of the command and the address included in the CA signals CA[1:I] may be in advance determined in compliance with various protocols.

The DQ buffers 1230 may include receivers receiving the DQ signals DQ[1:J] and transmitters transmitting the DQ signals DQ[1:J]. Each of the number of receivers and the number of transmitters may be identical to the number of the DQ pins 1130. The receivers of the DQ buffers 1230 may transmit the received DQ signals DQ[1:J] to the deserializer 1720. The transmitters of the DQ buffers 1230 may receive the DQ signals DQ[1:J] from the serializer 1710 and may output the received DQ signals DQ[1:J] to the outside through the DQ pins 1130.

The command decoder 1300 may receive the CA signals CA[1:I] from the CA buffers 1220. The command decoder 1300 may decode signals, which correspond to a command, from among the CA signals CA[1:I]. For example, the command decoder 1300 may decode an active command, a write command, a read command, a precharge command, a refresh command, a mode register set (MRS) command, and the like and may control components of the memory device 1000.

The command decoder 1300 may transmit a bank control signal B_CTRL, a row control signal R_CTRL, and a column control signal C_CTRL to the bank controllers 1500 in response to the activate command, the write command, the read command, the precharge command, the refresh command, or the like. The command decoder 1300 may control operations of any other components of the memory device 1000 in addition to the above-described components.

The banks 1400 may be memory cell arrays including memory cells repeatedly disposed. Memory cells may be disposed at intersections of word lines (not illustrated) and bit lines (not illustrated) of a bank. The number of banks 1400 may be in advance determined in compliance with various protocols of a memory chip. As the number of banks 1400 increases, all the memory cells of the memory device 1000 may be divided into more banks.

The bank controllers 1500 may control the banks 1400 based on the bank control signal B_CTRL, the row control signal R_CTRL, and the column control signal C_CTRL. In an example embodiment, the bank controllers 1500 may control the banks 1400, respectively. In another example embodiment, one bank controller may control two or more banks. In other words, one bank controller may be shared by two or more banks. Each of the bank controllers 1500 may include a row decoder 1510 and a column decoder 1520.

The row decoder 1510 may receive the row control signal R_CTRL from the command decoder 1300, may receive a row address RA from the CA buffers 1220, and may select a word line WL. For example, to drive word lines of a bank, the row decoder 1510 may be disposed along a direction in which word lines are disposed at regular intervals.

The column decoder 1520 may receive the column control signal C_CTRL from the command decoder 1300, may receive the column address CA from the CA buffers 1220, and may select a column selection line CSL. Because one or more bit lines (not illustrated) are connected with the column selection line CSL, the bit lines connected with the column selection line CSL may be selected by the column decoder 1520. For example, to drive column selection lines of a bank, the column decoder 1520 may be disposed along a direction in which column selection lines are disposed at regular intervals. In an implementation, the word lines and the column selection lines of the banks 1400 may cross each other.

The data buffers 1600 may transmit write data to the banks 1400 through global input/output lines GIO, or may receive read data from the banks 1400 through the global input/output lines GIO. The number of data buffers 1600 may be equal to the number of banks 1400, and the data buffers 1600 may exchange data with the banks 1400, respectively. The number of bits included in the write/read data may be determined in consideration of the number of prefetch bits, a burst length, the number of DQ pins 1130, and the like.

At least one of the data buffers 1600 may be selected by the command decoder 1300 depending on the read command or the write command. The number of data buffers that are selected in response to the read command or the write command may be determined, e.g., depending on the number of prefetch bits of the memory device 1000.

A data buffer that is selected depending on the write command may receive write data from the deserializer 1720, and the selected data buffer may transmit the write data to selected memory cells. The selected data buffer may drive a global input/output line and the selected memory cells based on the write data.

A data buffer that is selected depending on the read command may receive and store read data output from selected memory cells depending on the read command. The selected data buffer may sense and amplify a voltage of the global input/output line. The selected data buffer may transmit the read data to the serializer 1710.

The serializer 1710 may serialize bits of the read data in response to the read command. The deserializer 1720 may deserialize bits of the write data in a write operation. For example, the serializer 1710 may be implemented to include serializers, the number of which is equal to the number of DQ signals DQ[1:J], and the deserializer 1720 may be implemented to include deserializers, the number of which is equal to the number of DQ signals DQ[1:J].

The LDO regulator 100 may output the LDO output voltage VLDO to the CK buffer 1210. A function and an operation of the LDO regulator 100 and a connection relationship of components of the LDO regulator 100 are similar to the function and the operation of the LDO regulator 100 and the connection relationship of the components of the LDO regulators 100, 100b, . . . , 100i, which are described with reference to FIGS. 1 to 3 and 9A to 13B, and thus, additional description will be omitted to avoid redundancy. The LDO regulator 100 may stably supply a voltage to the CK buffer 1210. As the CK buffer 1210 operates at a high speed (i.e., in the case where a frequency of the clock signal CK and/or the internal clock signal ICK is high), the load on the CK buffer 1210 may sharply increase or decrease. In this case, the LDO regulator 100 may stably maintain a level of the LDO output voltage VLDO based on a wide bandwidth.

An example is illustrated in FIG. 14 in which the LDO output voltage VLDO is output only to the CK buffer 1210, but the LDO output voltage VLDO may also be output to various internal components of the memory device 1000 (e.g., the CA buffer 1220, the DQ buffer 1230, the command decoder 1300, the banks 1400, the bank controllers 1500, the data buffers 1600, the serializer 1710, and the deserializer 1720). Also, the LDO regulator 100 is illustrated as being included in the memory device 1000, but the LDO regulator 100 may be provided outside the memory device 1000.

By way of summation and review, when a memory device operates at a high speed, current consumption may change quickly. Thus, a regulator capable of responding at a high speed is desired. In a case where a response speed of the regulator is slow, an abnormal operation may occur in the load using the output voltage. Accordingly, there is a need for a regulator having an improved speed and able to quickly provide a stable voltage, e.g., to a clock buffer circuit in which the fluctuations of a load due to a high-speed data input/output are great.

As described above, embodiments may provide an LDO regulator that may operate at a high speed to stably supply an output voltage, even though a level of a current flowing to a system load sharply changes.

According to an example embodiment, the LDO regulator may secure a wide bandwidth.

Embodiments may provide a low dropout regulator having a wide bandwidth and operating at a high speed, and a memory device including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A low dropout (LDO) regulator, comprising:
   a first resistor;
   a first transistor including a gate terminal connected with a first end of the first resistor, a source terminal connected with a power supply voltage terminal, and a drain terminal connected with a first node;
   an operational amplifier including input terminals respectively connected with a reference voltage and the first node, and an output terminal;
   a second transistor including a gate terminal connected with the output terminal of the operational amplifier, a source terminal connected with the first node, and a drain terminal connected with a second node;
   a third transistor including a gate terminal connected with a second end of the first resistor, a source terminal connected with the power supply voltage terminal, and a drain terminal connected with a third node; and
   a current source connected between the second node and a ground voltage terminal.

2. The LDO regulator as claimed in claim 1, further comprising:
   a capacitor connected between the power supply voltage terminal and the second end of the first resistor.

3. The LDO regulator as claimed in claim 2, wherein the first resistor and the capacitor constitute a low pass filter.

4. The LDO regulator as claimed in claim 2, wherein the third transistor, the first resistor, and the capacitor constitute an active inductor.

5. The LDO regulator as claimed in claim 1, wherein the third transistor, the first resistor, and a gate-source capacitance of the third transistor constitute an active inductor.

6. The LDO regulator as claimed in claim 1, further comprising:
   a bias transistor including a gate terminal connected with the output terminal of the operational amplifier, a source terminal connected with the third node, and a drain terminal connected with the second node.

7. The LDO regulator as claimed in claim 1, further comprising:
   a second resistor connected between the first node and the source terminal of the second transistor.

8. The LDO regulator as claimed in claim 1, further comprising:
   a third resistor connected between the first node and a voltage division node; and
   a fourth resistor connected between the voltage division node and the ground voltage terminal.

9. The LDO regulator as claimed in claim 1, further comprising:
   a fifth resistor connected between the third node and the second node.

10. The LDO regulator as claimed in claim 1, further comprising:
  a fourth transistor including a gate terminal connected with a bias voltage terminal, a source terminal connected with the drain terminal of the third transistor, and a drain terminal connected with the third node.

11. The LDO regulator as claimed in claim 1, wherein each of the first to third transistors is a p-channel metal-oxide-semiconductor (PMOS) transistor.

* * * * *